US012683114B2

(12) United States Patent
Uesugi et al.

(10) Patent No.: US 12,683,114 B2
(45) Date of Patent: Jul. 14, 2026

(54) ELECTRON BEAM MODULATION DEVICE AND ELECTRON BEAM MODULATION METHOD

(71) Applicant: TOHOKU UNIVERSITY, Miyagi (JP)

(72) Inventors: Yuuki Uesugi, Sendai (JP); Shunichi Sato, Sendai (JP); Yuichi Kozawa, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 375 days.

(21) Appl. No.: 18/284,532

(22) PCT Filed: Feb. 22, 2022

(86) PCT No.: PCT/JP2022/007352
§ 371 (c)(1),
(2) Date: Sep. 28, 2023

(87) PCT Pub. No.: WO2022/209440
PCT Pub. Date: Oct. 6, 2022

(65) Prior Publication Data
US 2024/0177961 A1 May 30, 2024

(30) Foreign Application Priority Data
Mar. 30, 2021 (JP) ................................. 2021-056381

(51) Int. Cl.
*H01J 37/153* (2006.01)
*H01J 37/28* (2006.01)

(52) U.S. Cl.
CPC ............ *H01J 37/153* (2013.01); *H01J 37/28* (2013.01)

(58) Field of Classification Search
CPC .......... H01J 37/00; H01J 37/02; H01J 37/153; H01J 37/26; H01J 37/28; H01J 37/04;
(Continued)

(56) References Cited

U.S. PATENT DOCUMENTS 4,460,831 A * 7/1984 Oettinger ............... B82Y 10/00
313/542
4,758,092 A * 7/1988 Heinrich ............. G01R 31/308
356/365
(Continued)

FOREIGN PATENT DOCUMENTS

JP 2008-288099 A 11/2008
JP 2020-123533 A 8/2020

OTHER PUBLICATIONS

International Search Report mailed on Apr. 5, 2022, received for PCT Application PCT/JP2022/007352, filed on Feb. 22, 2022, 4 pages including English Translation.
(Continued)

*Primary Examiner* — Jason L McCormack
(74) *Attorney, Agent, or Firm* — XSENSUS LLP

(57) ABSTRACT

An electron beam modulation device according to the present disclosure includes a light source configured to emit laser light, a polarization conversion part including a modulation plane configured to modulate a direction of polarization and an intensity of the laser light emitted from the light source, and a condensing element configured to condense the laser light passing through the modulation plane. In a focal plane of the condensing element, a round light is generated that includes a trapping potential region in which electrons included in an electron beam incident on the focal plane are attracted and a repulsive potential region in which the electrons are repelled. The round light has rotational symmetry about an optical axis of the laser light when viewed along the optical axis.

1 Claim, 14 Drawing Sheets

(58) Field of Classification Search
    CPC .................... H01J 37/073; H01J 37/10; H01J
                          2237/06333; G02B 5/30
    USPC ...................... 250/505.1, 306, 307, 310, 311
    See application file for complete search history.

(56) References Cited

U.S. PATENT DOCUMENTS

| | | | | |
|---|---|---|---|---|
| 5,375,130 A | 12/1994 | Shih | | |
| 2021/0066029 A1* | 3/2021 | Shouji | .................. | H01J 37/228 |
| 2021/0098222 A1* | 4/2021 | Garcia Berrios | ..... | H01J 37/243 |
| 2022/0319803 A1* | 10/2022 | Axelrod | ................. | H01J 37/22 |

OTHER PUBLICATIONS

Uesugi et al., "Electron round lenses with negative spherical aberration by a tightly focused cylindrically polarized light beam", arXiv:2103.16406v1, Mar. 30, 2021, pp. 1-6.
Uesugi et al., "Electron round lenses with negative spherical aberration by a tightly focused cylindrically polarized light beam", arXiv:2103.16406v2, Jun. 4, 2021, pp. 1-6.

* cited by examiner

ELECTRON BEAM MODULATION DEVICE AND ELECTRON BEAM MODULATION METHOD

CROSS-REFERENCE TO RELATED APPLICATIONS

The present application is based on PCT filing PCT/JP2022/007352, filed Feb. 22, 2022, which claims priority from Japanese Patent Application No. 2021-056381, filed Mar. 30, 2021, the contents of each are incorporated herein in its entirety.

TECHNICAL FIELD

The present disclosure relates to an electron beam modulation device and an electron beam modulation method.

BACKGROUND ART

An electron microscope is a microscope that can obtain an enlarged image of a measurement target by using an electron beam. The electron beam is a wave with a very short wavelength. This enables observation at an exceedingly high magnification compared to an optical microscope or the like. In the related art, a lens used for converging or diverging an electron beam in an electron microscope is called an electron lens. As the electron lens, an electric field lens formed by an electrode plate or a magnetic lens formed by a magnetic flux coil, for example, has been used (refer to Patent Document 1, for example).

CITATION LIST

Patent Literature

Patent Document 1: JP 2020-123533 A

SUMMARY OF INVENTION

Technical Problem

In an electron microscope, a positive spherical aberration occurs not only when the electron beam is converged using an electron lens such as in the related art, but also simply by accelerating electrons. A positive spherical aberration increases a width of the electron beam irradiating the measurement target and decreases a resolution of the electron microscope. To reduce this positive spherical aberration that occurs in the electron microscope, the following method is known: for example, disposing a plurality of non-circularly symmetric electron lenses in a circumferential direction about a traveling direction of the electron beam, controlling positions, outputs, and the like of these electron lenses with high accuracy to generate a negative spherical aberration, and using the generated negative spherical aberration to cancel out the positive spherical aberration that originally occurred. However, in such a method of using combined electron lenses to suppress a spherical aberration, the plurality of electron lenses are driven precisely and simultaneously. This causes problems such as difficulty in control, susceptibility to noise, and high manufacturing and installation costs.

A scanning transmission electron microscope (STEM) has exceedingly high resolution even among electron microscopes and enables observation on the order of 1 Å. An acceleration voltage of electrons in a typical STEM is about 80 to 300 kV. However, to allow the STEM to be used in applications such as organism observation, advances have been made to reduce the acceleration voltage to, for example, 30 kV or less.

Furthermore, when an electron lens that generates a strong magnetic field is used as an objective lens in an electron microscope, it is difficult to observe a measurement target having magnetism, which is also a problem. To address this problem, a method of using a pair of magnetic lenses (electron lenses) that generate magnetic fields in mutually opposite directions to render a boundary region between the pair of magnetic lenses magnetic field-free and disposing the measurement target in the magnetic field-free region has been proposed. However, in this method of using a pair of magnetic lenses to form the magnetic field-free region, there is a problem in that the region rendered magnetic field-free is very narrow in the traveling direction of the electron beam, resulting in significant restrictions on shape and arrangement of the measurement target having magnetism.

The present invention provides an electron beam modulation device and an electron beam modulation method that can modulate an electron beam by applying round light, are easily constructible, and with which conditions for generating the round light are easy to control.

Solution to Problem

An electron beam modulation device according to the present invention includes a light source configured to emit laser light, a polarization conversion part including a modulation plane configured to modulate a direction of polarization and an intensity of the laser light emitted from the light source such that the direction of the polarization and the intensity have a predetermined directional distribution and a predetermined intensity distribution, respectively, and a condensing element configured to condense the laser light passing through the modulation plane. In a focal plane of the condensing element, the laser light is condensed by the condensing element to generate round light including a trapping potential region in which electrons included in an electron beam incident on the focal plane are attracted and a repulsive potential region in which the electrons are repelled. The round light has rotational symmetry about an optical axis of the laser light when viewed along the optical axis. The predetermined directional distribution and the predetermined intensity distribution are determined in accordance with a distribution of the trapping potential region and the repulsive potential region in the focal plane.

In the electron beam modulation device described above, the modulation plane may be designed such that, when the laser light is viewed along the optical axis, there exist a polarization singularity region and, surrounding the polarization singularity region, a polarization modulation region in which a direction of polarization is distributed with rotational symmetry about the polarization singularity region.

In the electron beam modulation device described above, in the polarization modulation region, the direction of polarization may be in a radial direction about the polarization singularity region. In the focal plane, a maximum repulsive potential region having an annular shape may be formed about the optical axis, the trapping potential region and the repulsive potential region may be alternately formed radially outward of the maximum repulsive potential region while being attenuated, and a high-intensity portion having a high light intensity may be formed at a central portion including the optical axis and a low-intensity portion having a light intensity of substantially zero may be formed at an outer peripheral portion outward of the central portion.

In the electron beam modulation device described above, in the polarization modulation region, the direction of polarization may be aligned with a tangent in a circumferential direction about the polarization singularity region. In the focal plane, a maximum trapping potential region having an annular shape may be formed about the optical axis, the repulsive potential region and the trapping potential region may be alternately formed radially outward of the maximum trapping potential region while being attenuated, and a low-intensity portion having a light intensity of substantially zero may be formed at a central portion including the optical axis and a high-intensity portion having a light intensity higher than that at the central portion may be formed at an outer peripheral portion outward of the central portion.

In the electron beam modulation device described above, the predetermined intensity distribution may be a distribution in which a portion having a high light intensity is annularly formed about the optical axis.

In the electron beam modulation device described above, the laser light may have an annular beam shape about the optical axis, and an angle formed by the laser light condensed by an outermost peripheral portion of the condensing element and the optical axis may be 25 degrees or less.

An electron beam modulation method according to the present invention includes modulating a direction and an intensity of polarization of laser light emitted from a light source to a predetermined directional distribution and a predetermined intensity distribution, respectively, condensing, by a condensing element, the laser light modulated to generate round light including a trapping potential region in which electrons are attracted and a repulsive potential region in which the electrons are repelled, the round light having rotational symmetry about an optical axis of the laser light when viewed along the optical axis, and modulating an electron beam incident on the round light in accordance with a relative distribution of the trapping potential region and the repulsive potential region.

Advantageous Effects of Invention

According to the present invention, it is possible to provide an electron beam modulation device and an electron beam modulation method that can modulate an electron beam by applying round light, are easily constructible, and with which conditions for generating the round light are easy to control.

DESCRIPTION OF EMBODIMENTS

Hereinafter, an electron beam modulation device and an electron beam modulation method according to embodiments of the present invention will be described with reference to the drawings. Note that, in the following description and drawings, components having the same or similar functions are denoted by the same reference signs.

Figure 1:
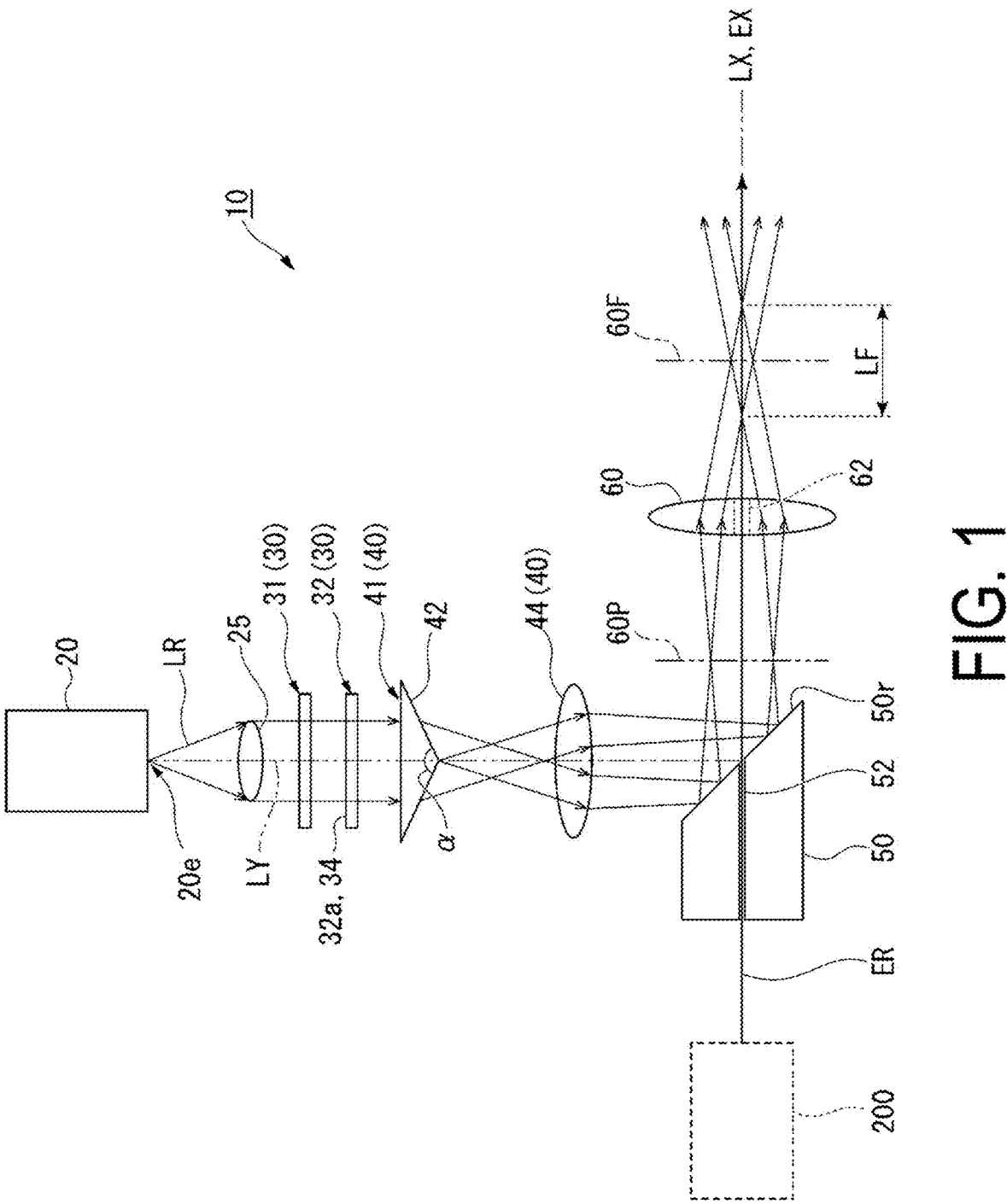
FIG. 1 is a schematic diagram of an electron beam modulation device according to an embodiment of the present invention.

As shown in FIG. 1, an electron beam modulation device 10 according to the present embodiment is used to modulate an electron beam ER emitted in an accelerated state from an electron beam source 200, such as an electron microscope, by manipulating the electron beam ER circularly symmetrically about an axis [LX] EX of the electron beam ER in an electric field-free and magnetic field-free state without using an existing electron lens or the like. Specifically, the electron beam modulation device 10 according to the present embodiment generates a round light RL for manipulating the electron beam ER circularly symmetrically about the axis EX as described above.

As shown in FIG. 1, the electron beam modulation device 10 according to the present embodiment includes a light source 20, a collimator lens 25, a polarization conversion part 30, a beam shaping part 40, a mirror 50, and a condensing element 60. The light source 20 is a laser light source and emits a laser light LR in the form of a linearly polarized light beam from an exit port 20e.

The laser light LR emitted from the light source 20 is incident on the collimator lens 25 and converted into parallel light. Subsequently, the laser light LR is incident on the polarization conversion part 30 and converted into a cylindrically symmetric polarized beam. The laser light LR converted into the cylindrically symmetric polarized beam is shaped into an annular shape by the beam shaping part 40. A material of the collimator lens 25 is, for example, quartz, but may be a material other than quartz, such as sapphire, as long as the material has a desired refractive index and can transmit the laser light LR.

Figure 2:
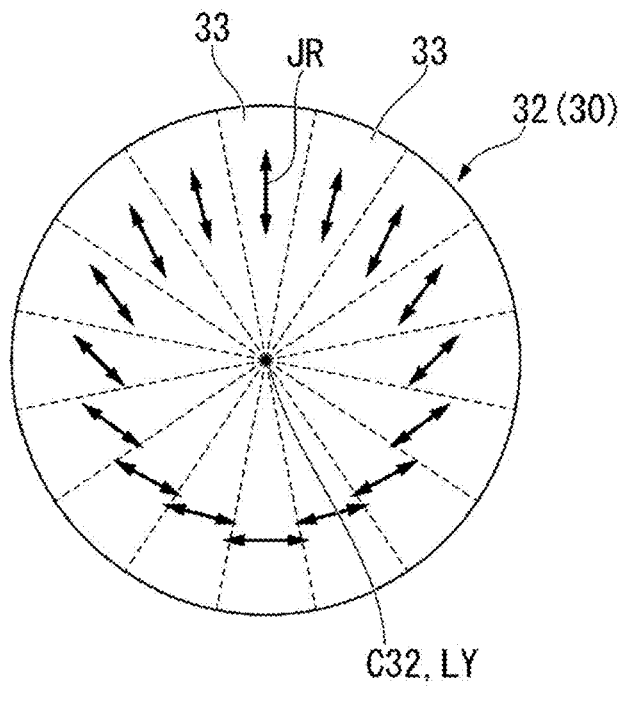
FIG. 2 is a front view of a liquid crystal optical element included in the electron beam modulation device shown in FIG. 1.

The polarization conversion part 30 includes, for example, a wavelength plate 31 and a liquid crystal optical element 32 formed of a liquid crystal element. A material of the wavelength plate 31 is, for example, crystal, but may be a material having birefringence other than crystal, and is not particularly limited as long as the material is capable of manipulating the polarization of the laser light LR. In the polarization conversion part 30, the wavelength plate 31 and the liquid crystal optical element 32 are sequentially disposed on an optical axis LY from a side close to the light source 20. The liquid crystal optical element 32 includes two glass plates and liquid crystal molecules, and exhibits birefringence with respect to the incident laser light LR. The two glass plates are disposed away from each other, and a space between the two glass plates in a direction along the optical axis LY is filled with the liquid crystal molecules. As shown in FIG. 2, the liquid crystal optical element 32 is divided into equal small regions 33 of a predetermined angle in a circumferential direction from a center C32 concentric with the optical axis LY of the laser light LR. That is, the liquid crystal optical element 32 includes a plurality of the small regions 33. In each of the small regions 33, a plurality of liquid crystal molecules are disposed with axial directions (e.g., major axis directions or minor axis directions) thereof aligned. An orientation JR of the axes of the liquid crystal molecules disposed in each of the plurality of small regions 33 is rotated by approximately 90° with respect to an orientation of the axes of the liquid crystal molecules disposed in the small region 33 at the halfway point in the circumferential direction. That is, the orientation JR of the axes of the liquid crystal molecules disposed in the plurality of small regions 33 is sequentially different in each small region 33 about the circumferential direction.

Figure 3:
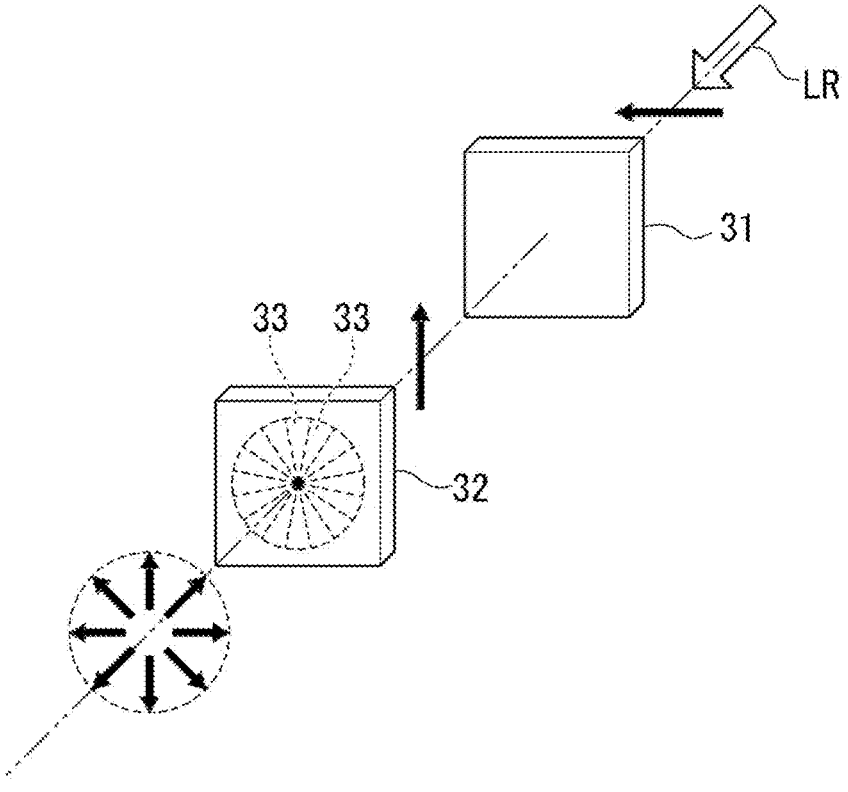
FIG. 3 is a perspective view of a polarization conversion part included in the electron beam modulation device shown in FIG. 1.
Figure 4:
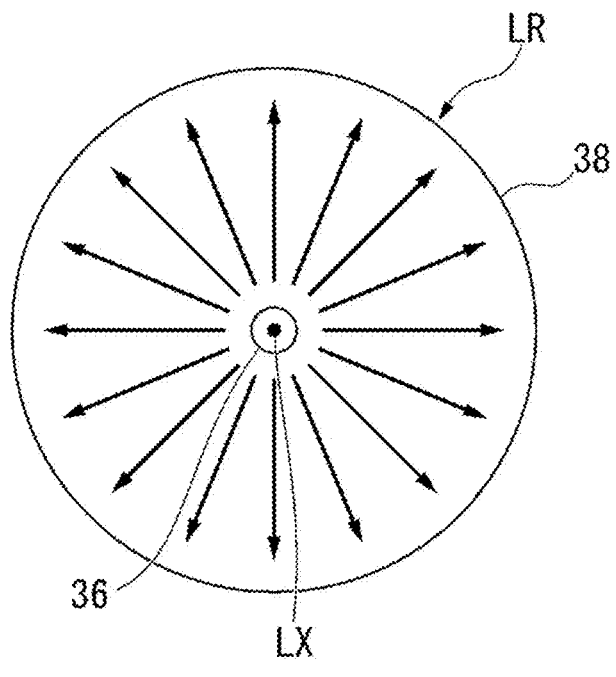
FIG. 4 is a schematic view of a first example of a directional distribution of laser light in the electron beam modulation device shown in FIG. 1.

When a polarization direction of the laser light LR emitted from the wavelength plate 31 is parallel to a vertical direction, in a plane orthogonal to the optical axis LX of the laser light LR transmitted through the plurality of small regions 33 of the liquid crystal optical element 32 and emitted from the liquid crystal optical element 32 as shown in FIG. 3, a polarization singularity region 36 through which the optical axis LY passes and a polarization modulation region 38 formed surrounding the polarization singularity region 36 exist as shown in FIG. 4. In the polarization singularity region 36, oscillation of an electric field is not defined, and therefore an intensity of the laser light LR is zero. As will be described below, the polarization singularity region 36 is a region that does not act on nor affect the oscillation direction or the like of the electron beam ER, even when the electron beam ER passes through the polarization singularity region 36 coaxially with the optical axis LY. The polarization modulation region 38 has rotational symmetry about the polarization singularity region 36. Generally, the electron beam ER does not pass through the polarization modulation region 38. As shown in FIG. 4, a direction of the polarization of the laser light LR in the polarization modulation region 38 is in a radial direction about the polarization singularity region 36, that is, the optical axis LY. Such a directional distribution of the laser light LR will be referred to as a first example of a directional distribution (predetermined directional distribution). The laser light LR having the first example of the directional distribution is referred to as a radially polarized (R-pol) light beam.

Figure 5:
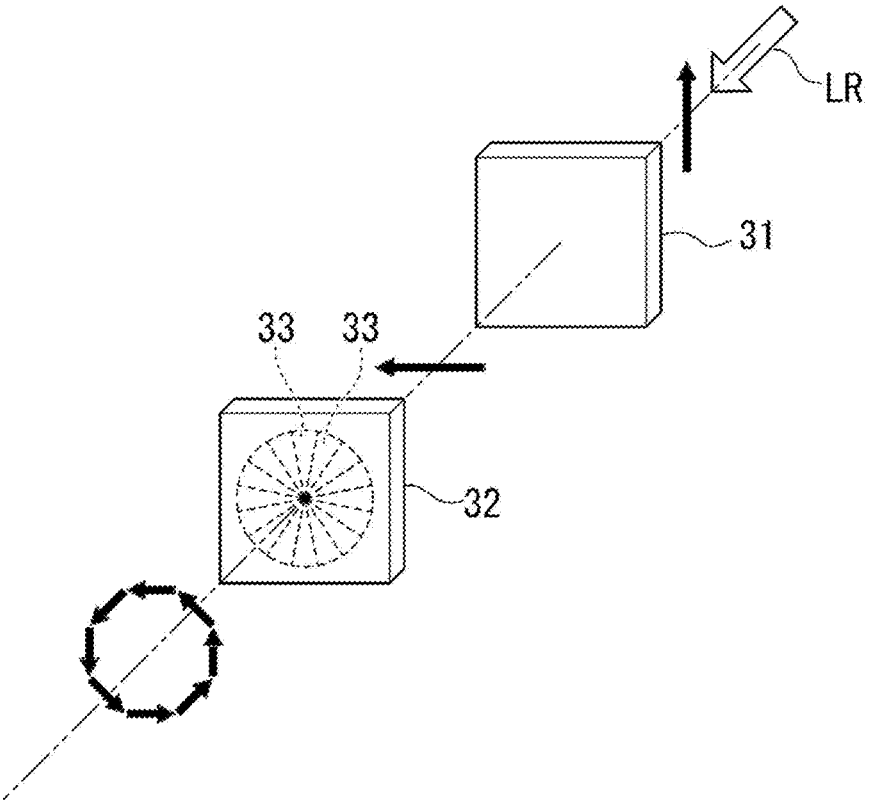
FIG. 5 is a perspective view of the polarization conversion part included in the electron beam modulation device shown in FIG. 1.
Figures 6, 7:
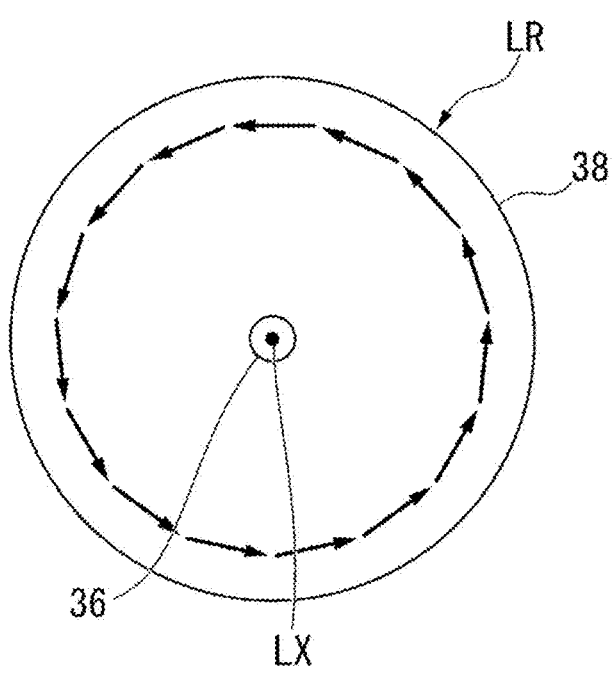
FIG. 6 is a schematic view of a second example of a directional distribution of laser light in the electron beam modulation device shown in FIG. 1.
FIG. 7 is a perspective view of the polarization conversion part included in the electron beam conversion device shown in FIG. 1.

When the polarization direction of the laser light LR emitted from the wavelength plate 31 is parallel to a horizontal direction as shown in FIG. 5, in a plane orthogonal to the optical axis LX of the laser light LR transmitted through the plurality of small regions 33 of the liquid crystal optical element 32 and emitted from the liquid crystal optical element 32, the polarization singularity region 36 and the polarization modulation region 38 formed surrounding the polarization singularity region 36 exist as shown in FIG. 6. However, when the polarization direction of the laser light LR emitted from the wavelength plate 31 is parallel to the horizontal direction, the direction of the polarization of the laser light LR in the polarization modulation region 38 is in a circumferential direction about the polarization singularity region 36, that is, the optical axis LY and is aligned with a tangent in the circumferential direction, as shown in FIG. 6. Such a directional distribution of the laser light LR is referred to as a second example of a directional distribution (predetermined directional distribution). The laser light LR having the second example of the directional distribution is referred to as an azimuthally polarized (A-pol) light beam.

Examples of a third example of a directional distribution and a third example of an intensity distribution different to those of the first example and the second example include a case in which the polarization direction of the laser light LR emitted from the wavelength plate 31 is circular when viewed along the optical axis LY, that is, a case in which the laser light LR emitted from the wavelength plate 31 is circularly polarized light, as shown in FIG. 7. In this case, the laser light LR in the polarization modulation region 38 includes circularly polarized light at positions corresponding to each of the plurality of small regions 33 of the liquid crystal optical element 32.

The type and necessity of the wavelength plate 31 are selected in accordance with the directional distribution of the laser light LR emitted from the liquid crystal optical element 32 and the linearly polarized light of the laser light LR emitted from the light source 20. For example, as shown in FIG. 3, when the linearly polarized light of the laser light LR emitted from the light source 20 is parallel to the horizontal direction and the laser light LR having the first example of R-pol directional distribution is desirably emitted from the liquid crystal optical element 32, a $\lambda/2$ wavelength plate (that is, a half-wavelength plate) can be used as the wavelength plate 31 to make the direction of polarization of the laser light LR prior to incidence on the liquid crystal optical element 32 parallel to the vertical direction. In the example shown in FIG. 3, the wavelength plate 31 can be omitted as long as the linearly polarized light of the laser light LR emitted from the light source 20 is parallel to the vertical direction, and the laser light LR emitted from the light source 20 may be directly incident on the liquid crystal optical element 32.

Similarly, as shown in FIG. 5, when the linearly polarized light of the laser light LR emitted from the light source 20 is parallel to the vertical direction and the laser light LR having the A-pol directional distribution in the second example is desirably emitted from the liquid crystal optical element 32, a $\lambda/2$ wavelength plate can be used as the wavelength plate 31 to make the direction of polarization of the laser light LR prior to incidence on the liquid crystal optical element 32 parallel to the horizontal direction. In the example shown in FIG. 5, the wavelength plate 31 can be omitted as long as the linearly polarized light of the laser light LR emitted from the light source 20 is parallel to the horizontal direction, and the laser light LR emitted from the light source 20 may be directly incident on the liquid crystal optical element 32.

As described above, the polarization conversion part 30 converts the directional distribution of the laser light LR, which is a linearly polarized light beam emitted from the light source 20, into a desired directional distribution, such as the first example of the directional distribution. That is, a conversion plane (modulation plane) 34 on which the liquid crystal is non-uniformly aligned as described above is formed in at least a region of an incident surface 32a of the liquid crystal optical element 32 where the laser light LR is incident. The direction of polarization of the laser light LR, which is a linearly polarized light beam when emitted from the light source 20, is converted into a predetermined directional distribution in a space on the emission side of the liquid crystal optical element 32 when the laser light LR passes through the conversion plane 34. That is, the liquid crystal optical element 32 includes the conversion plane 34 that converts the direction of polarization of the laser light LR into a predetermined directional distribution. When the conversion plane 34 is, for example, composed of liquid crystal molecules designed by controlling the orientation direction as described above, the orientation direction of the liquid crystal molecules is designed such that the incident polarized beam is converted into a polarized beam having a desired polarization distribution (directional distribution) by birefringence of the liquid crystal molecules.

The beam shaping part 40 includes, for example, an axicon lens 41, a convex lens 44, the mirror 50, and the condensing element 60. In the beam shaping part 40, the wavelength plate 31 and the liquid crystal optical element 32 are sequentially disposed, from the side closer to the light source 20, on the optical axis LY frontward of the polarization conversion part 30 in a traveling direction of the laser light LR. In the beam shaping part 40, the mirror 50 and the condensing element 60 are sequentially disposed, from the side closer to the light source 20, on the optical axis LX formed by folding the optical axis LY substantially 90°, frontward of the polarization conversion part 30 in the traveling direction of the laser light LR.

The axicon lens 41 is formed in a conical shape, and has an inclined surface 42 linearly approaching the light source 20 as distance from the optical axis LY increases with the optical axis LY as a vertex, when viewed from a direction orthogonal to the optical axis LY. Since the axicon lens 41 has the inclined surface 42, the axicon lens 41 forms a beam profile (intensity distribution) having an annular shape when viewed along the optical axis LY. A diameter of the annular beam profile of the laser light LR depends on a vertex angle α of the inclined surface 42, and increases as a separation distance between the axicon lens 41 and the convex lens 44 on the optical axis LY becomes increasingly longer than a formation region of a Bessel beam. Further, a width of the annular beam profile of the laser light LR in a radial direction is constant at a predetermined value without dependence on the vertex angle α of the inclined surface 42 and the separation distance between the axicon lens 41 and the convex lens 44. The vertex angle α of the axicon lens 41 is preferably from 120° to 150°, for example, from the viewpoint of forming the laser light LR having a suitable annular shape such that the electron beam ER passes through the central portion when viewed along the optical axis LX, as described below.

The convex lens 44 focuses the laser light LR emitted from the axicon lens 41 to form an image. The laser light LR having a beam profile that is rotationally symmetric with respect to the optical axis LX when viewed along the optical axis LX is formed on an imaging surface. A reflective surface 50r of the mirror 50 is disposed between the imaging surface and the exit surface of the convex lens 44. A material of the axicon lens 41 and the convex lens 44 is, for example, quartz, but may be a material other than quartz, such as sapphire, as long as the material has a desired refractive index and can transmit the laser light LR.

The mirror 50 is formed in a cylindrical shape, for example, and has the reflective surface 50r that forms an angle of substantially 45° with respect to an axial line. A through-hole 52 is formed in the mirror 50 having a cylindrical shape along the axial line, that is, the axis EX of the electron beam ER. The axial line of the mirror 50 is orthogonal to the optical axis LY leading to the light source 20 and overlaps the axis EX. The reflective surface 50r overlaps an intersection point at which the optical axis LY and the axial line of the mirror 50 are orthogonal to each other, and forms an angle of substantially 45° with respect to the optical axis LY and the axis EX. The reflective surface 50r is provided with a metal reflective film made of, for example, gold (Au) or aluminum (Al), or an optical reflective film made of a dielectric multilayer film. To avoid charging, a material of the mirror 50 is, for example, stainless steel (SUS), copper (Cu), or quartz with a metal film made of Au, for example, deposited on a surface thereof. Further, the mirror 50 is appropriately grounded to a housing of the electron microscope. A diameter and a length of the through-hole 52 and a shape of an end portion thereof are appropriately formed such that the quality of the electron beam ER does not deteriorate due to, for example, a mirror image effect by which a positive charge is induced at an inner wall of the through-hole 52 by the charge of the electron beam ER.

The laser light LR, which is a cylindrically symmetric polarized beam shaped into an annular shape, is reflected by the reflective surface 50r of the mirror 50 at substantially 90° toward a side opposite to the electron beam source 200 on the axis EX. Hereinafter, the optical axis of the laser light LR reflected by the reflective surface 50r is referred to as the optical axis LX. That is, the optical axis LY of the laser light LR is refracted by 90° by the reflective surface 50r and becomes the optical axis LX. On the other hand, the electron beam ER is emitted from the electron beam source 200 in an accelerated state, passes through the through-hole 52 without being affected by the mirror 50, and travels straight. The optical axis LX substantially overlaps the axis EX of the electron beam ER.

With the beam shaping part 40, the axicon lens 41 and the convex lens 44 are used to shape the laser light LR into a rotationally symmetric polarized beam. The shaped laser light LR is reflected by the reflective surface 50r of the mirror 50 and travels along the optical axis LX. At this time, when viewed from a direction parallel to the optical axis LX, the laser light LR is shaped into a beam profile in which a region having a high light intensity is formed annularly about the optical axis LX. Further, the convex lens 44 and the condensing element 60 are designed such that an imaging position (focal plane of the convex lens 44) at which an outer diameter of the annular beam profile centered on the optical axis LX is the smallest coincides with a pupil plane 60P of the condensing element 60. A material of the condensing element 60 is, for example, quartz similarly to the convex lens 44, but may be a material other than quartz, such as sapphire, as long as the material has a desired refractive index and can transmit the laser light LR.

The condensing element 60 is at least provided on the optical axis LX frontward of the convex lens 44 in an emission direction of the laser light LR, and is disposed such that the pupil plane 60P of an entrance pupil coincides with the focal plane of the convex lens 44. The condensing element 60 is a lens with a geometric aberration appropriately corrected. Serving as a region through which the electron beam ER passes, a through-hole 62 is formed at a central portion of the condensing element 60 in the radial direction through which the optical axis LX and the axis EX pass. The condensing element 60 is, for example, an objective lens for an optical microscope from which a geometric aberration is appropriately removed. The laser light LR in the pupil plane 60P of the condensing element 60 is shaped into an annular shape by the beam shaping part 40 and has an intensity distribution forming a minimum annular width at the focal plane of the convex lens 44. As shown in FIG. 1, the laser light LR is temporarily condensed at the pupil plane 60P with circular symmetry about the optical axis LX, diffused while maintaining the circular symmetry, and incident on the condensing element 60.

Figure 8:
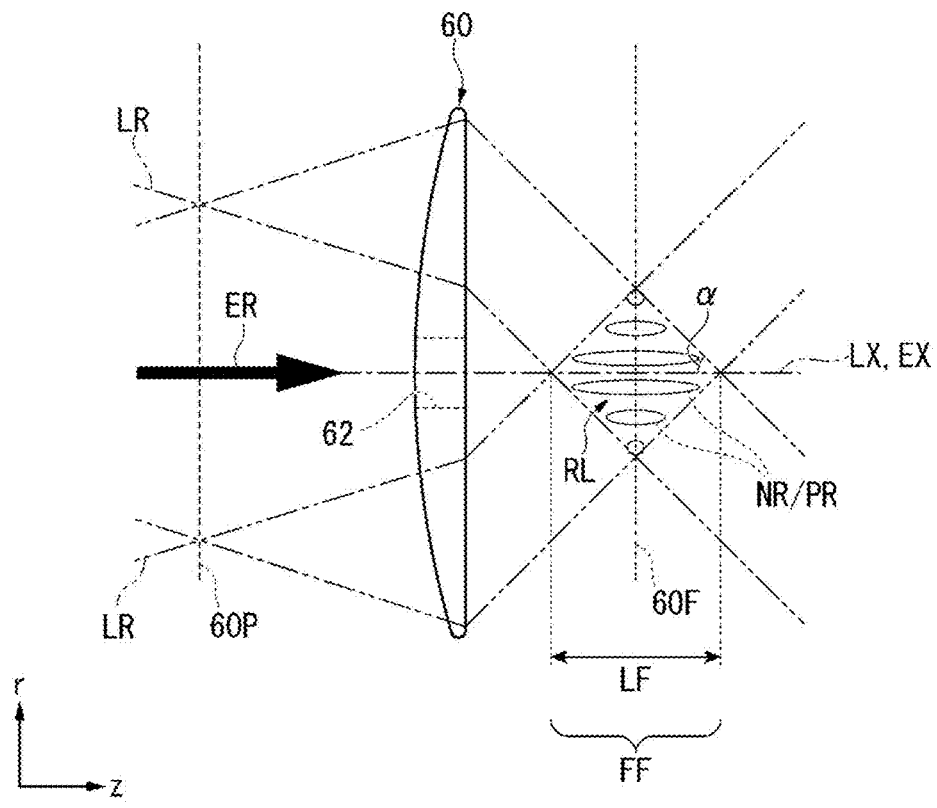
FIG. 8 is an enlarged view of a region from a pupil plane to a focal plane of a condensing element included in the electron beam modulation device shown in FIG. 1.

As shown in FIG. 8, when viewed along the optical axis LX, the laser light LR having an annular shape and distributed in the circumferential direction of the optical axis LX is circularly symmetrically incident on the condensing element 60 positioned on an outer periphery of the through-hole 62 and condensed in a focal plane 60F of the condensing element 60. Condensing the laser light LR by the condensing element 60 generates the round light RL having rotational symmetry about the optical axis LX. The round light RL has a predetermined focus length LF substantially centered on the focal plane 60F in the z-direction along the optical axis LX. The focus length LF is determined by an annular width of the laser light LR in the pupil plane 60P, and increases in length as the annular width decreases.

The round light RL includes a trapping potential region NR and a repulsive potential region PR based on the distribution of a ponderomotive potential determined from the optical field of the condensed laser light LR. In the trapping potential region NR, electrons included in the electron beam ER are attracted to a center side in a radial direction (r-direction) about the optical axis LX. On the other hand, in the repulsive potential region PR, electrons included in the electron beam ER are repelled outward in the r-direction. Based on these principles, the electron beam ER that passes through the through-hole 62 formed in the condensing element 60 and is incident on the focal plane 60F is converged or diffused in accordance with the distribution of the trapping potential region NR and the repulsive potential region PR in the round light RL, and modulated in accordance with the distribution.

A magnitude of the potential of the trapping potential region NR and a magnitude of the potential of the repulsive potential region PR depend on a numerical aperture (NA) of the condensing element 60. As the NA of the condensing element 60 increases, the laser light LR is more intensely condensed at a wide angle with respect to the optical axis LX, and thus the magnitudes of the potentials of the trapping potential region NR and the repulsive potential region PR increase. Accordingly, in consideration of factors such as power of the incident laser light LR that can be input and speed of the electron beam ER to be modulated, the NA of the condensing element 60 is set to a suitable NA at which at least the trapping potential region NR and the repulsive potential region PR having magnitudes of potential equal to or greater than those required to modulate the electron beam ER to a desired pattern can be generated. From the viewpoint of suppressing the power of the incident laser light LR and protecting the device from thermal damage and the like, the NA of the condensing element 60 is desirably 0.7 or greater, and preferably as close to 1 as possible.

In the electron beam modulation method according to the present embodiment, for example, the electron beam modulation device 10 described above is used to generate the round light RI, having rotational symmetry about the optical axis LX by condensing, by the condensing element 60, the laser light LR having a direction of polarization modulated to a predetermined directional distribution and an intensity modulated to a predetermined intensity distribution. In the electron beam modulation method according to the present embodiment, the electron beam ER incident on the round light RL is modulated by the trapping potential region NR and the repulsive potential region PR of the round light RL. In the electron beam modulation method according to the present embodiment, the round light RL, which is completely different from an electron lens used in the related art, is used for modulation, such as convergence of the electron beam ER. Further, the electron beam ER is modulated while the electron beam ER travels and while a space 100 in which the electron beam modulation device 10 is disposed is in an electric field-free and magnetic field-free state. The space 100 is, for example, a space in a lens barrel through which the electron beam ER travels in an electron microscope.

Numerical Calculation Example 1 Related to Modulation of Electron Beam

Next, a first numerical calculation example (hereinafter referred to as Numerical Calculation Example 1) related to modulation of the electron beam ER using the electron beam modulation device 10 described above will be described. In Numerical Calculation Example 1, the first example of the directional distribution and the first example of the intensity distribution were adopted as the predetermined directional distribution and the predetermined intensity distribution, respectively. That is, the direction of polarization of the laser light LR passing through the conversion plane 34 of the liquid crystal optical element 32 of the electron beam modulation device 10 was set to be modulated to R-pol such as that shown in FIG. 3. In this case, the intensity of the laser light LR passing through the conversion plane 34 is distributed highly in an annular manner (with rotational symmetry) about the optical axes LY, LX when viewed from the directions along the optical axes LY, LX.

Here, based on the fact that the laser light LR can be regarded as monochromatic light, the electric field of the laser light LR is defined by the following Equation (1).

Equation 1

$$\vec{E}^{in}(\vec{r};t) = E_0\mathrm{Re}\left[\vec{u}^{in}(\vec{r})e^{-i\omega t}\right] \tag{1}$$

In Equation (1), $E_0$ represents an amplitude of the electric field, $\omega$ represents an angular frequency of the laser light LR, and $<<u>>^{in}$ represents a unit vector forming a spatial structure of amplitude, phase, and polarized light when the space 100 is regarded as a field. Note that an arrow above a character in the equation or $<<\ >>^{in}$ the equation indicates that the variable of the character in the equation or the character surrounded by $<<\ >>$ is a vector. In the pupil plane 60P of the condensing element 60 of the electron beam modulation device 10, the laser light LR can be regarded as parallel light. Therefore, when the condensing element 60 is a convex lens, a wavefront obtained after the laser light LR passes through the pupil plane 60P is converted into a spherical wave that converges about the focal point on the optical axis LX. A field of a focal region FF including the focal plane 60F of the condensing element 60 is obtained by integrating a field of a plane wave converging within a range of a maximum convergence angle $\alpha$ toward the focal point. The maximum convergence angle $\alpha$ is represented by $\sin^{-1}$ (NA). (NA) represents the NA of the condensing element 60.

Here, when a cylindrical coordinate system $<<r>>=<<r>>$ (r, $\varphi$, z) is introduced, a unit vector $<<u>>^{in}$ of the R-pol laser light LR propagating along the z-axis in the z-direction in FIG. 6 and incident on the condensing element 60 is expressed by the following Equation (2).

Equation 2

$$\vec{u}^{in} = \left(u_r^{in}, 0, 0\right) \tag{2}$$

In the cylindrical coordinate system, when the theory of vector diffraction integration is applied, the field of the laser light LR condensed by the condensing element 60 is expressed by the following Equations (3) to (5).

Equation 3

$$u_r(r,z) = C\int_0^\alpha d\theta P(\theta)\sin 2\theta J_1(kr\sin\theta)e^{ikz\cos\theta} \tag{3}$$

$$u_z(r,z) = 2iC\int_0^\alpha d\theta P(\theta)\sin^2\theta J_0(kr\sin\theta)e^{ikz\cos\theta} \tag{4}$$

$$u_\phi(r,z) = 2C\int_0^\alpha d\theta P(\theta)\sin\theta J_1(kr\sin\theta)e^{ikz\cos\theta} \tag{5}$$

In Equations (3) to (5), C equals $\pi f/\lambda$, f represents a focal length of the condensing element 60, $\lambda$ represents a peak wavelength or a center wavelength of the laser light LR, and $J_n$ represents an n-th order Bessel function. $P(\theta)$ represents an apodizing function determined to satisfy the energy conservation law between the incident side and the exit side of the condensing element 60, and is represented by the following Expression (6) on the basis of Abbe's principle applied to an objective lens or the like.

Equation 4

$$P(\theta) = p(f\sin\theta)\sqrt{\cos\theta} \tag{6}$$

$p(r)=p(f\cdot\sin\theta)$ in Equation (6) represents an amplitude of a rotationally-symmetric incident field in the pupil plane 60P. For the field of the incident light on the condensing element 60, to express incident round light having an annular shape, the field of incidence in Equation (7) in which an inner diameter is 0.9 times an outer diameter is defined.

Equation 5

$$|\vec{u}^{in}| = p(r) = \begin{cases} 1 & \text{for } (0.9\ f\ \sin\alpha \le r \le f\sin\alpha) \\ 0 & \text{for } (0 \le r \le 0.9\ f\ \sin\alpha) \end{cases} \tag{7}$$

In this numerical calculation example, $\lambda$ equals 1 [μm], f equals 4 [mm], NA equals 0.9, $P_{in}$ equals 100 [W], and $E_e$ equals 1 [keV]. On the basis of the principles described above, the light intensity distribution of the condensed laser light LR is obtained by the sum of a radial component and an axial component of the intensity, $|u_r|^2+|u_z|^2$, and an azimuth component of the intensity $|u\Phi|^2$. With the magnetic field dependent on a 0-order Bessel function, the axial component has a maximum value on the optical axis LX while the radial component and the azimuthal component are zero on the optical axis LX.

The ponderomotive forces acting on electrons e in the focal region FF are expressed by the following Equations (8) and (9).

Equation 6

$$\vec{F}(\vec{r}) = -U_p \nabla |\vec{u}(\vec{r})|^2 \tag{8}$$

$$U_p = \frac{q^2 E_0^2}{4m\omega^2} \tag{9}$$

In Equations (8) and (9), q represents a charge of the electrons e, and m represents a mass of the electrons e. $U_p$ represents the ponderomotive energy corresponding to the magnitude of the distribution of the ponderomotive potential (simply referred to as "potential" in some cases). At this time, the following Equation (10) is established.

Equation 7

$$\vec{F} = -U_P \left[ (\vec{u} \cdot \nabla)\vec{u} + \vec{u} \times (\nabla \times \vec{u}) + cc \right] \tag{10}$$

In Equation (10), cc represents a complex conjugate term. Here, when the NA of the condensing element 60 is close to 1, the second term (u×(∇×u*)) in Equation (10) is dominant. In this term, in order to generate a force in the r-direction, it is necessary to orient either <<u>> or (∇×<<u>>*) in the axial direction. In Numerical Calculation Example 1, calculation was performed ignoring the first term ((u·∇)u*), which is relatively smaller than the second term, in Equation (10). With the laser light LR being modulated to R-pol, the normalized electric field is given by <<u>>=(U_r, 0, u_z), and the normalized magnetic field is expressed by the following Equation (11).

Equation 8

$$\nabla \times \vec{u} = (0, \partial_2 u, -\partial, u_2, 0) \tag{11}$$

The following Equations (12) to (14) are obtained from the Equations (3), (4), and (11) described above.

Equation 9

$$\partial, u, -\partial, u, = iku_\phi \tag{12}$$

$$J_0(ax)' = -aJ_1(ax) \tag{13}$$

$$\nabla \times \vec{u} = ik(0, u_\phi, 0) \tag{14}$$

Accordingly, in Numerical Calculation Example 1 in which the laser light LR is modulated to R-pol, the ponderomotive force of the round light RL in the focal plane 60F is expressed by the following Equation (15).

Equation 10

$$\vec{F}'' = -kU_p \left[ (iu_z \hat{u}_\phi, 0, -iu_p u_\phi^*) + cc \right] \tag{15}$$

Figure 9:
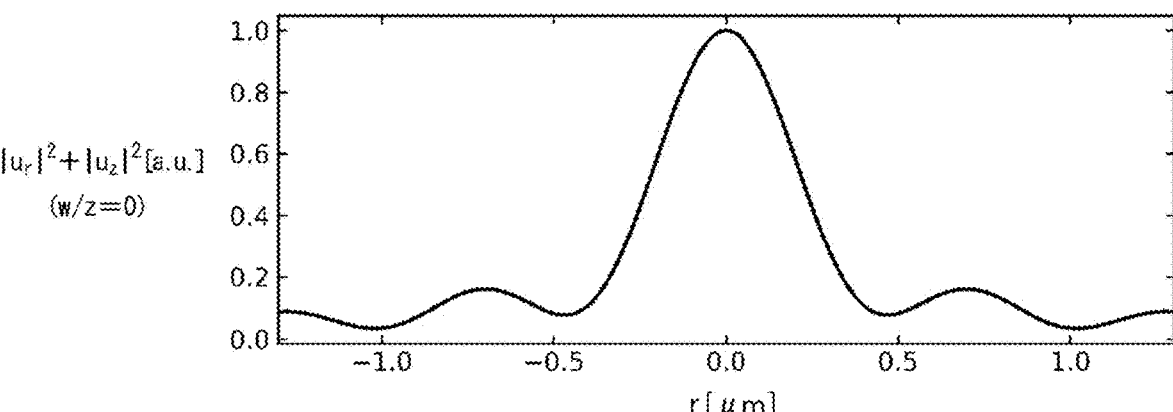
FIG. 9 is a diagram showing a calculation result of a light intensity distribution of round light in Numerical Calculation Example 1.

FIG. 9 shows a result of calculating the light intensity distribution of the round light RL in the focal region FF on the basis of the principles, design parameters, and Equations described above. In FIG. 9 and subsequent drawings, z=0 [μm] represents the focal plane 60F, and r=0 [μm] represents the optical axis LX. As shown in FIG. 9, it can be seen that the light intensity of the round light RL based on the laser light LR modulated to R-pol is highest on the optical axis LX (that is, z=0 [μm]). Further, it can be seen that the light intensity of the round light RL rapidly decreases while fluctuating as a distance from the optical axis LX increases in the r-direction.

Figure 10:
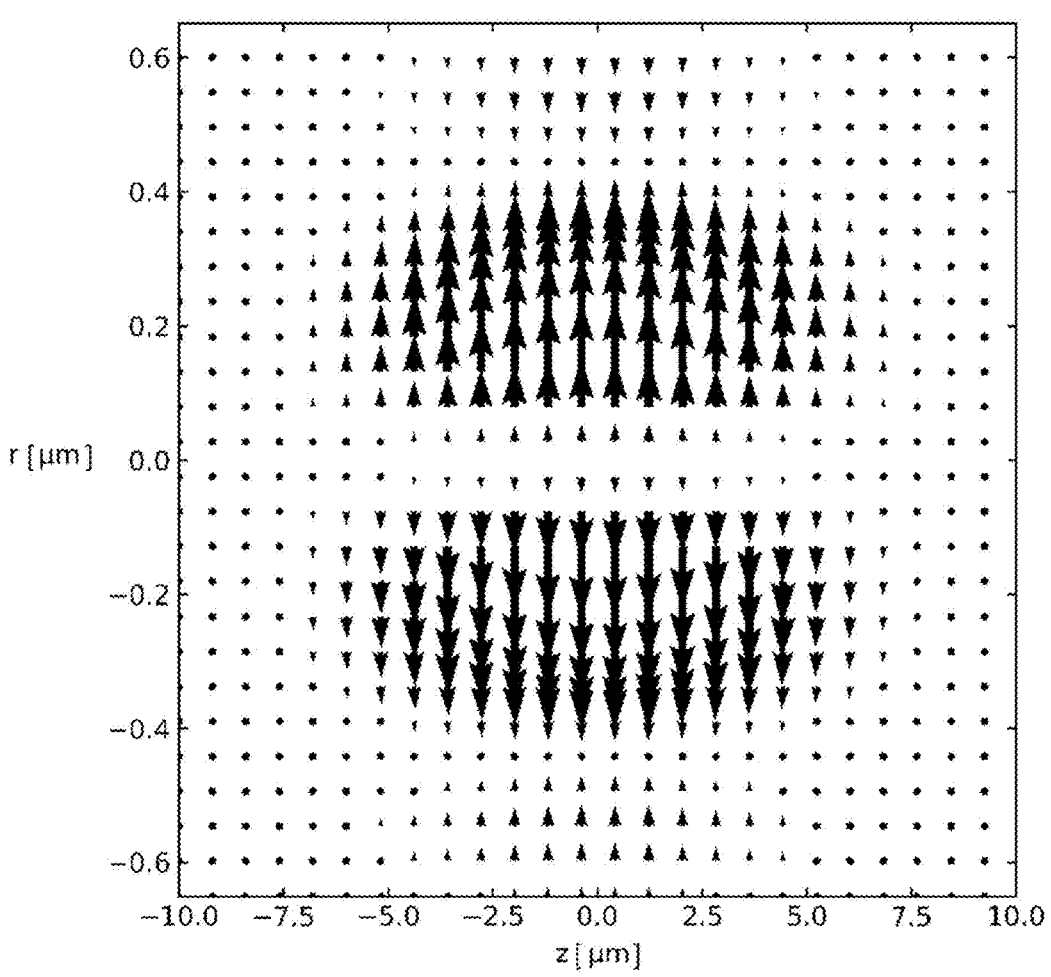
FIG. 10 is a diagram showing a calculation result of a vector field of forces acting on electrons in an r-direction and a z-direction in Numerical Calculation Example 1.

FIG. 10 shows a result of calculating the ponderomotive force of the round light RL at z=0 [μm] in the focal region FF on the basis of the principles, design parameters, and Equations described above. The ponderomotive force shows a large value where a gradient of the light intensity shown in FIG. 9 is large. Further, a magnitude of the component of the ponderomotive force in the z-direction is approximately one hundredth a magnitude of the component in the r-direction, and the action on the electrons e in the electron beam ER is dominated by the contribution in the r-direction. Further, a z-direction component of the ponderomotive force has a property in which signs are reversed on the side close to and on the side far from the condensing element 60 with respect to the focal plane 60F. For this reason, the action of accelerating the electrons e included in the incident electron beam ER in the +z-direction (that is, right side of the drawing sheet of FIG. 8) and the action of decelerating the electrons e in the −z-direction (that is, left side of the drawing sheet of FIG. 8) cancel each other out across the focal region FF, and the component of the ponderomotive force in the z-direction has no net effect on the electrons e.

Integrating the ponderomotive force field at z=0 [μm] across the r-direction to zero at infinity resulted in an effective repulsive potential region $PR_{MAX}$ having a maximum value closest to the optical axis LX. Further, as a distance from the optical axis LX increases in the r-direction, the magnitude of the potential decreases, and the trapping potential region NR and the repulsive potential region PR each having a smaller value than the maximum value alternately occur outwardly of the repulsive potential region $PR_{MAX}$. In the repulsive potential region PR, a force acts on the electrons e included in the incident electron beam ER in a direction away from a local vertex of the potential shape. On the other hand, in the trapping potential region NR, a force acts on the electrons e in a direction approaching a local bottom of the potential shape. In the distribution shown in FIG. 10, it can be seen that the repulsive potential region $PR_{MAX}$ causes the electrons e of the electron beam ER to be subject to a large force in a direction away from the optical axis LX.

Figure 11:
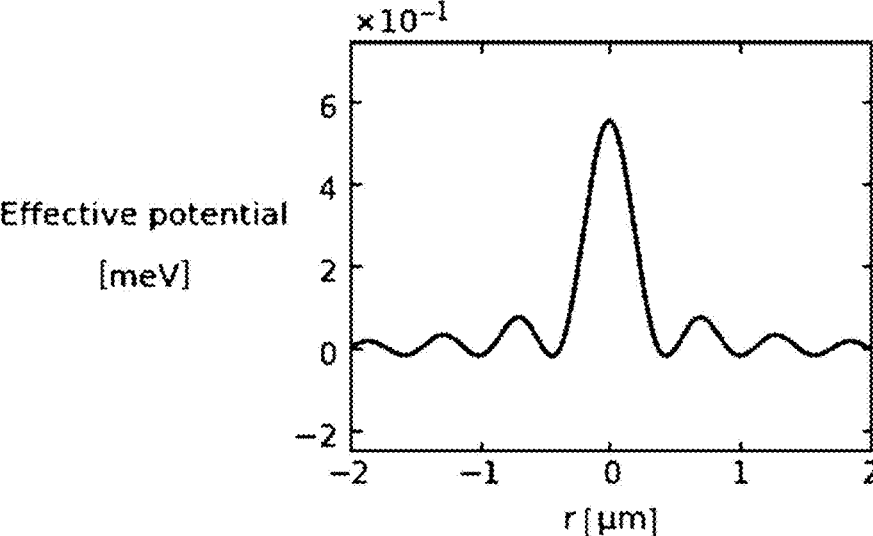
FIG. 11 is a diagram showing a calculation result of an effective potential of the round light in the focal plane of the condensing element in Numerical Calculation Example 1.

FIG. 11 shows a result of calculating an effective potential distribution (effective potential) in the focal plane 60F (that is, z=0 [μm]). As shown in FIG. 11, it is clear that the repulsive potential region $PR_{MAX}$ appears at z=0 on the optical axis LX, and that the potential values of each of the repulsive potential region PR and the trapping potential region NR rapidly decrease outwardly in the r-direction.

Figure 12:
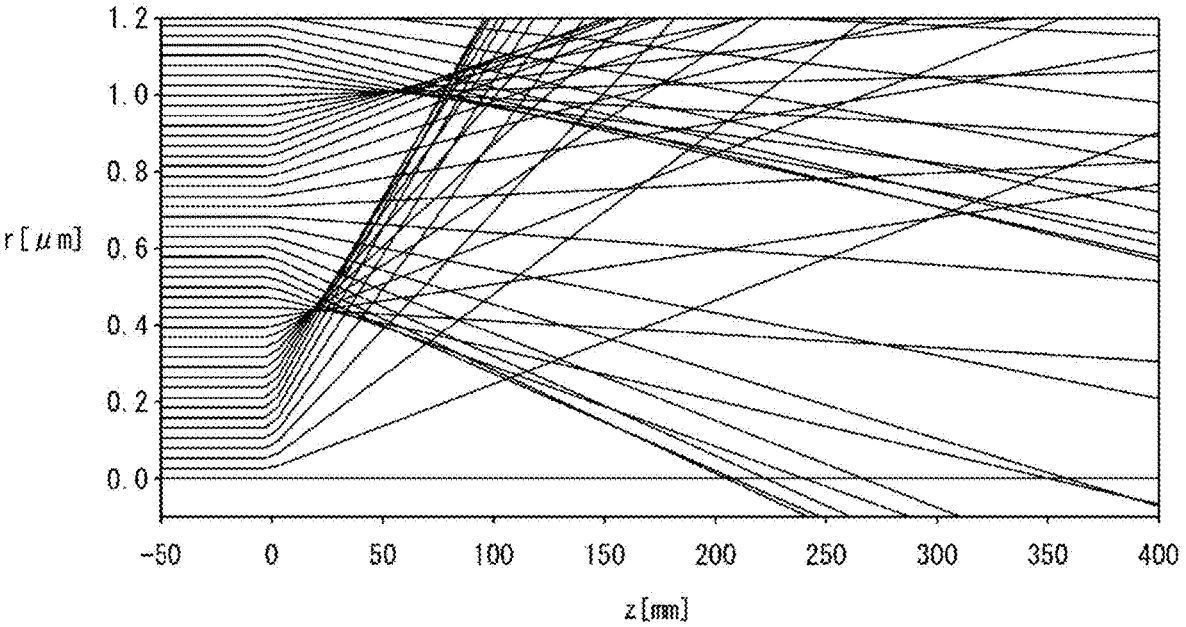
FIG. 12 is a diagram showing a calculation result of a trajectory of an electron beam in Numerical Calculation Example 1.

FIG. 12 shows the result of calculating a trajectory of the electron beam ER in the focal region FF. The repulsive potential region $PR_{MAX}$ occurs in a region where r is approximately 0.4 or less in the calculation result shown in FIG. 12. As shown in FIG. 12, it was confirmed that the parallel electron beam ER incident from the left side diverges outwardly in the r-direction mainly due to the repulsive potential region $PR_{MAX}$ with respect to the round light RL.

Figure 13:
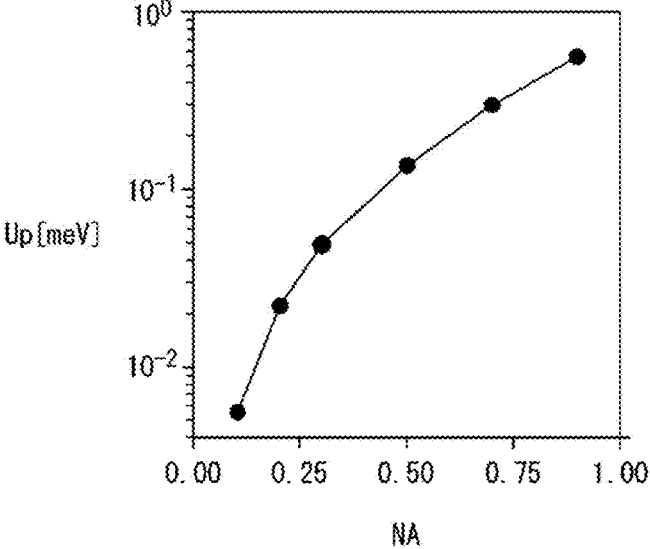
FIG. 13 is a graph showing a calculation result of a maximum value of the effective potential when an NA of a lens of the condensing element is changed in Numerical Calculation Example 1.
Figure 14:
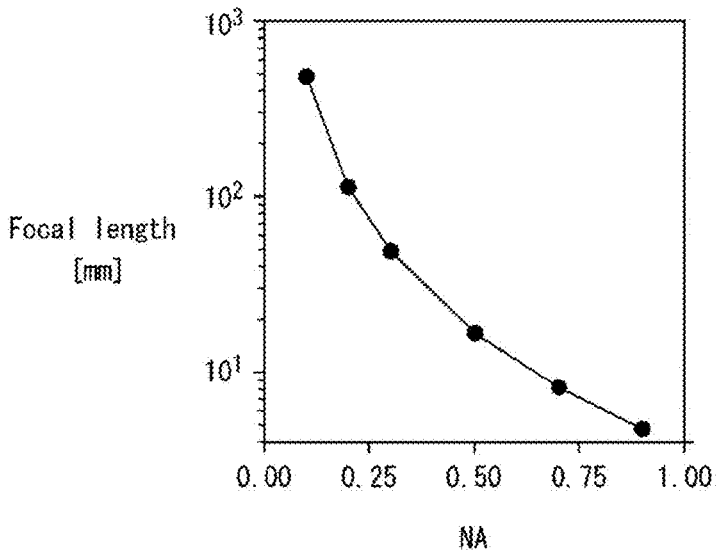
FIG. 14 is a graph showing a calculation result of a focal length of the electron beam traveling in the z-direction along the vicinity of an optical axis in the r-direction when the NA of the lens of the condensing element is changed in Numerical Calculation Example 1.

Furthermore, FIGS. 13 and 14 show the result of calculating the focal length from the maximum value of the repulsive potential region $PR_{MAX}$ and the trajectory of the electron beam ER traveling in the z-direction along the vicinity of the optical axis LX in the r-direction when the NA of the lens constituting the condensing element 60 is changed. Even when the power of the laser light LR emitted from the light source 20 is constant, the light intensity on the optical axis LX decreases and generation of the electric field in the z-direction decreases as the condensing angle (that is, the maximum converging angle α) of the condensing element 60 decreases. As shown in FIGS. 13 and 14, as the NA of the condensing element 60 becomes smaller, the repulsive potential region $PR_{MAX}$ becomes smaller, the focal length of the electron beam ER becomes longer, and the function of the round light RL to modulate the electron beam ER becomes weaker. That is, conversely, it can be said that the function of the round light RL modulating the electron beam ER intensifies as the NA of the condensing element 60 increases.

Numerical Calculation Example 2 Related to Modulation of Electron Beam

Next, a second numerical calculation example (hereinafter referred to as Numerical Calculation Example 2) related to modulation of the electron beam ER using the electron beam modulation device 10 described above will be described. In Numerical Calculation Example 2, the directional distribution of the second example and the intensity distribution of the second example are adopted as the predetermined directional distribution and the predetermined intensity distribution. That is, the direction of polarization of the laser light LR passing through the conversion plane 34 of the liquid crystal optical element 32 of the electron beam modulation device 10 was set to be modulated to A-pol such as that shown in FIG. 6.

The calculations of the intensity distribution and field of the laser light LR, and the calculations and the like of the repulsive potential region PR and the trapping potential region NR of the round light RL as well as the principles and the like are substantially the same as that described in Numerical Calculation Example 1. However, replacements are as follows.

When the direction of polarization of the laser light LR is A-pol, Equation (2) described above is replaced with the following Equation (16).

Equation 11

$$\vec{u}^{(*)} = \left(0, u_p^{i,n}, 0\right) \qquad (16)$$

According to Equation (16) and the equations described above, Equations (14) and (15) described above are replaced with the following Equations (17) and (18).

Equation 12

$$\nabla \times \vec{u} = -ik(u_r, 0, u_z) \qquad (18)$$

$$\vec{F}^A = -kU_p[(iu_\phi u_z^*, 0, -iu_\phi u_r^*) + cc]$$

Figure 15:
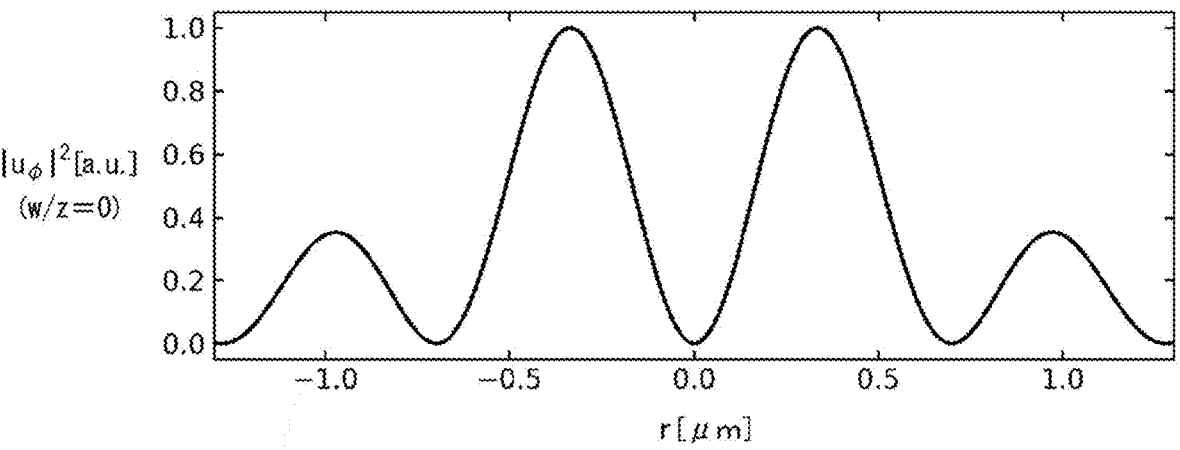
FIG. 15 is a diagram showing a calculation result of a light intensity distribution of the round light in Numerical Calculation Example 2.

FIG. 15 shows a result of calculating the light intensity distribution of the round light RL in the focal region FF on the basis of the principles and equations described above and design parameters similar to those of Numerical Calculation Example 1. As shown in FIG. 15, it can be seen that the light intensity of the round light RL based on the laser light LR modulated to A-pol is substantially zero on the optical axis LX (that is, z=0 [μm]), and is distributed annularly and cylindrically with rotational symmetry about the optical axis LX when viewed along the optical axis LX. Further, it can be seen that the light intensity of the round light RL decreases as a distance from the optical axis LX increases in the r-direction.

Figure 16:
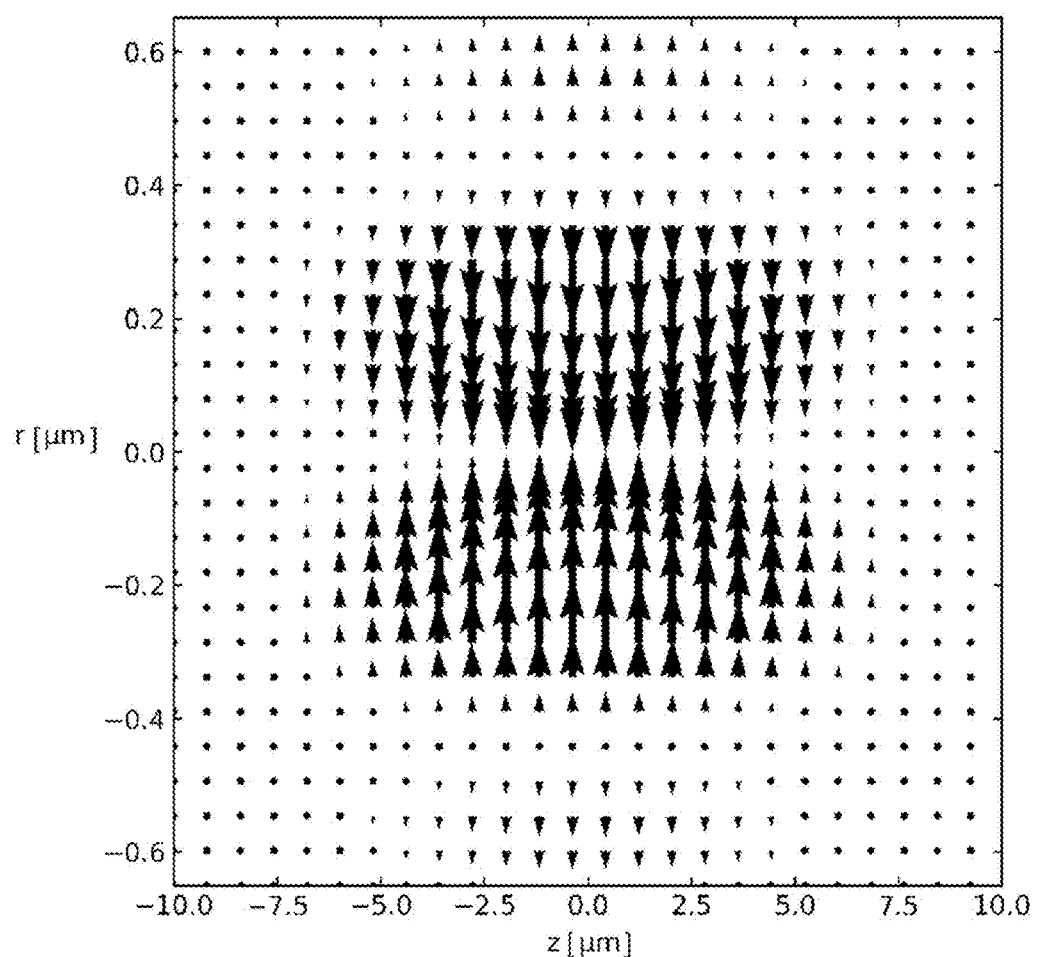
FIG. 16 is a diagram showing a calculation result of a vector field of forces acting on electrons in the r-direction and the z-direction in Numerical Calculation Example 2.

FIG. 16 shows a result of calculating the ponderomotive force of the round light RL in the focal region FF on the basis of the principles, design parameters, and equations described above. As in Numerical Calculation Example 1, the ponderomotive force shows a large value where the gradient of the light intensity shown in FIG. 15 is large. Further, the magnitude of the component of the ponderomotive force in the z-direction is about one hundredth the magnitude of the component in the r-direction. In Numerical Calculation Example 2, as in Numerical Calculation Example 1, the action on the electrons e included in the electron beam ER is dominated by the contribution in the r-direction, and the components in the z-direction cancel each other out across the focal region FF and do not exert a net action on the electrons e.

In FIG. 16, when the field of the ponderomotive force at z=0 [μm] was integrated across the r-direction to 0 at infinity, a trapping potential region $NR_{MAX}$ having a minimum value closest to the optical axis LX was generated, which was the opposite to Numerical Calculation Example 1. Further, as the distance from the optical axis LX increases in the r-direction, the magnitude of the potential decreases, and the repulsive potential region PR and the trapping potential region NR larger than the minimum value are alternately generated outwardly of the trapping potential region $NR_{MAX}$. In the distribution shown in FIG. 16, it can be seen that the trapping potential region $NR_{MAX}$ causes the electrons e of the electron beam ER to be subject to a large force in a direction approaching the optical axis LX.

Figure 17:
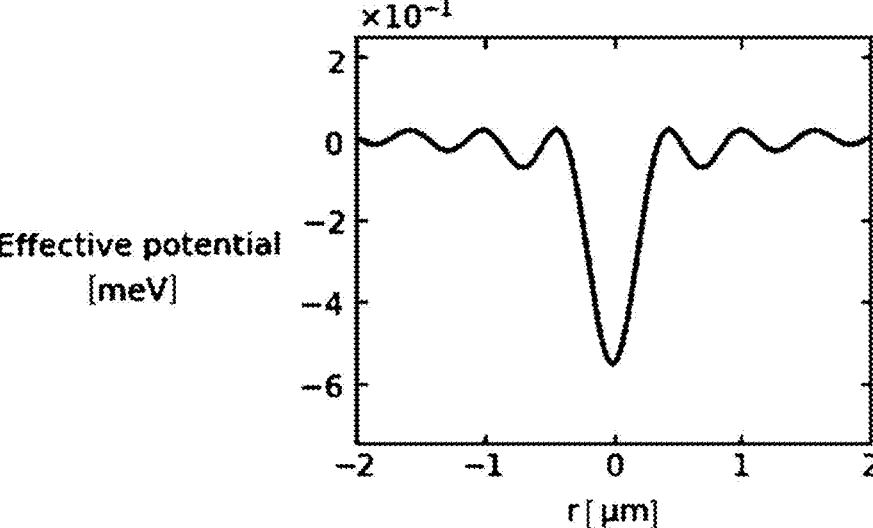
FIG. 17 is a diagram showing a calculation result of an effective potential in the focal plane of the condensing element in Numerical Calculation Example 2.

FIG. 17 shows a result of calculating an effective potential based on the ponderomotive force of the round light RL at the focal plane 60F (that is, z=0 [μm]). As shown in FIG. 17, it is clear that the trapping potential region $NR_{MAX}$ appears at z=0 on the optical axis LX, and that the respective potential values of the repulsive potential region PR and the trapping potential region NR rapidly decrease outwardly in the r-direction.

Figure 18:
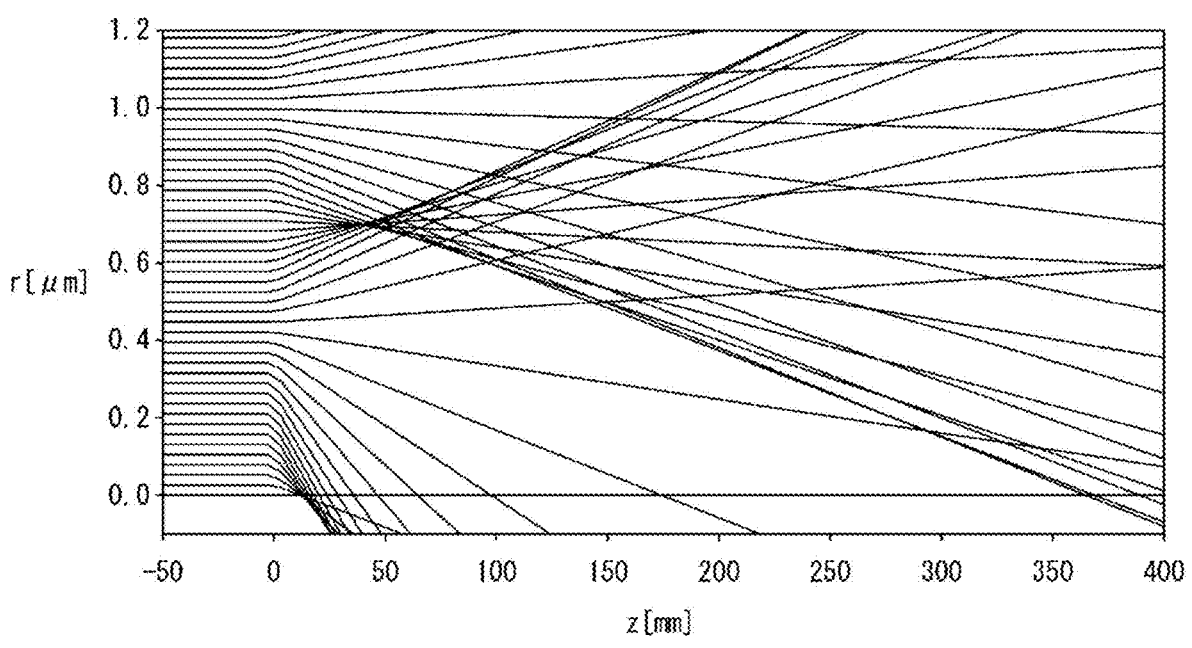
FIG. 18 is a diagram showing a calculation result of a trajectory of an electron beam in Numerical Calculation Example 2.

FIG. 18 shows the result of calculating a trajectory of the electron beam ER in the focal region FF. The trapping potential region $NR_{MAX}$ occurs in a region where r is approximately 0.4 or less in the calculation result shown in FIG. 18. As shown in FIG. 18, it was confirmed that the parallel electron beam ER incident from the left side converges toward the optical axis LX in the r-direction mainly due to the trapping potential region $NR_{MAX}$ with respect to the round light RL.

The electron beam modulation device 10 according to the present embodiment described above includes at least the light source 20, the polarization conversion part 30, and the condensing element 60. The light source 20 emits the laser light LR. The polarization conversion part 30 has the conversion plane 34 that modulates the direction of polarization and the intensity of the laser light LR emitted from the light source 20 such that the direction of polarization and the intensity of the laser light LR have a predetermined directional distribution and a predetermined intensity distribution, respectively. The condensing element 60 condenses the laser light LR passing through the conversion plane 34. In the focal plane 60F of the condensing element 60, the round light RL is generated in the focal plane 60F by the laser light LR being condensed by the condensing element 60. The round light RL includes the trapping potential region NR in which the electrons e included in the incident electron beam ER are attracted and the repulsive potential region PR in which the electrons e are repelled, and has rotational symmetry about the optical axis LX when viewed along the optical axis LX of the laser light LR.

The electron beam modulation device 10 of the present embodiment can generate the round light RI, using the laser light LR, in place of an electric field lens or a magnetic lens used in the related art for modulating the electron beam ER. The electron beam modulation device 10 according to the present embodiment includes the light source 20, the polarization conversion part 30, and the condensing element 60 as main components, and is easy to construct. In addition, the conditions for generating the round light RL can be easily controlled by the design of the conversion plane 34 and the like. The focal length of the round light RL is directly proportional to the power of the laser light LR and is inversely proportional to the acceleration voltage of the electron beam ER. The conditions of the round light RL and the design parameters of the condensing element 60 can be determined in consideration of such conditions. The electron beam modulation device 10 according to the present embodiment can reduce the power of the laser light LR, and can be applied to, for example, an electron microscope having a low acceleration voltage of 30 kV or less. Further, the electron beam modulation device 10 according to the present embodiment can be applied to an objective lens in a measurement system for a measurement target that requires an electric field-free and magnetic field-free state, and an aberration correction device of a low acceleration STEM or a low acceleration SEM. The electron beam modulation device 10 according to the present embodiment is also useful as a device constituting a phase plate having a rotationally symmetric shape for electronic phase imaging.

In the electron beam modulation device 10 according to the present embodiment, the conversion plane 34 of the liquid crystal optical element 32 constituting the polarization conversion part 30 is designed on the basis of diffraction theory or the like such that the polarization singularity region 36 and the polarization modulation region 38 surrounding the polarization singularity region 36 exist when the laser light LR emitted from the conversion plane 34 is viewed along the optical axes LY, LX. In the polarization singularity region 36, the intensity of the laser light LR is zero. The direction of polarization of the polarization modulation region 38 is distributed with rotational symmetry about the polarization singularity region 36.

According to the electron beam modulation device 10 of the present embodiment, it is possible to easily realize an action similar to that of an electron lens in the related art by shaping a polarized beam that is circularly symmetric about the optical axes LY, LX by the conversion plane 34 and condensing the shaped laser light LR by the condensing element 60.

In the electron beam modulation device 10 according to the present embodiment, the direction of polarization of the laser light LR in the polarization modulation region 38 is in the radial direction about the polarization singularity region 36. In the focal plane 60F of the condensing element 60 of the electron beam modulation device 10 according to the present embodiment, when viewed along the optical axis LX, the repulsive potential region $PR_{MAX}$ (effective repulsive potential region) having an annular shape is formed about the optical axis LX, and the trapping potential region NR and the repulsive potential region PR are alternately formed outwardly in the r-direction (outwardly in the radial direction) of the repulsive potential region $PR_{MAX}$ while being attenuated. Further, in the focal plane 60F, a high-intensity portion where the light intensity of the laser light LR is higher than that at an outer peripheral portion is formed at a central portion including the optical axis LX, and a low-intensity portion where the light intensity of the laser light LR is substantially zero is formed at the outer peripheral portion.

According to the electron beam modulation device 10 of the present embodiment, the repulsive potential region $PR_{MAX}$ acts on the electrons e included in the electron beam ER incident on the round light RL in the focal region along the optical axis LX and the axis EX so as to repel the electrons e outwardly in the r-direction from the optical axis LX, making it possible to realize the action of a concave lens and obtain a positive spherical aberration.

In the electron beam modulation device 10 according to the present embodiment, the direction of polarization of the laser light LR in the polarization modulation region 38 is aligned with a tangent in the circumferential direction about the polarization singularity region 36. In the focal plane 60F of the condensing element 60 of the electron beam modulation device 10 according to the present embodiment, when viewed along the optical axis LX, the trapping potential region $NR_{MAX}$ (effective trapping potential region) having an annular shape is formed about the optical axis LX, and the repulsive potential region PR and the trapping potential region NR are alternately formed outwardly in the r-direction (outwardly in the radial direction) of the trapping potential region $NR_{MAX}$ while being attenuated. Further, in the focal plane 60F, a low-intensity portion where the light intensity of the laser light LR is substantially zero is formed at a central portion including the optical axis LX, and a high-intensity portion where the light intensity of the laser light LR is higher than that at the central portion is formed at an outer peripheral portion outward of the central portion.

According to the electron beam modulation device 10 of the present embodiment, the trapping potential region $NR_{MAX}$ acts on the electrons e included in the electron beam ER incident on the round light RL in the focal region along the optical axis LX and the axis EX in a direction approaching the optical axis LX in the r-direction, making it possible to realize the action of a convex lens and obtain a negative spherical aberration. In an electron lens in the related art, such as an electric field lens or a magnetic lens, only a positive spherical aberration occurs and a negative spherical aberration cannot be achieved. According to the electron beam modulation device 10 of the present embodiment, the positive spherical aberration that is generated solely by the acceleration of the electron beam ER can be readily canceled by the negative spherical aberration of the round light RL, and spherical aberration can be suppressed.

In the electron beam modulation device 10 according to the present embodiment, the predetermined intensity distribution of the laser light LR is a distribution in which a portion having a high light intensity is annularly formed about the optical axes LY, LX when viewed along the optical axes LY, LX.

According to the electron beam modulation device 10 of the present embodiment, it is possible to obtain the focus length LF in the focal region FF by shaping the polarized beam that is circularly symmetric about the optical axes LY, LX into an annular shape by the conversion plane 34 and condensing the shaped laser light LR by the condensing element 60.

In the electron beam modulation method according to the present embodiment, the direction of polarization and the intensity of the laser light LR emitted from the light source 20 are modulated to a predetermined directional distribution and a predetermined intensity distribution, respectively, and the modulated laser light LR is condensed by the condensing element 60. As a result, the round light RL including the trapping potential region PR in which electrons are attracted and the repulsive potential region NR in which the electrons are repelled and that has rotational symmetry about the optical axis LX when viewed along the optical axis LX is generated. In the electron beam modulation method according to the present embodiment, the electron beam ER incident on the round light RL is modulated in accordance with the relative distribution of the trapping potential region NR and the repulsive potential region PR.

The electron beam modulation method of the present embodiment can generate the round light RL using the laser light LR and modulate the electron beam ER in an electric field-free and magnetic field-free state, and easily control the conditions for generating the round light RL by the design of the conversion plane 34 and the like, in place of an electric field lens or a magnetic lens used in the related art to modulate the electron beam ER.

In Numerical Calculation Examples 1 and 2 described above, calculation was made ignoring the first term $((<<u>>\cdot\nabla)<<u>>^*)$, which is relatively smaller than the second term, in Equation (10). When the NA of the condensing element 60 is large, the actual result is substantially the same as the result obtained when ignoring the first term $((<<u>>\cdot\nabla)<<u>>^*)$. When the NA of the condensing element 60 is small, the actual result differs from the result obtained when ignoring the first term $((<<u>>\cdot\nabla)<<u>>^*)$. In a case in which the direction of polarization of the laser light LR emitted from the conversion plane 34 of the liquid crystal optical element 32 of the electron beam modulation device 10 is modulated to R-pol, when the NA of the condensing element 60 is small and the first term $((<<u>>\cdot\nabla)<<u>>^*)$ cannot be ignored, the action of the convex lens on the electron beam ER appears.

Numerical Calculation Example 3 Related to Modulation of Electron Beam

Next, a third numerical calculation example (hereinafter referred to as Numerical Calculation Example 3) in which calculations related to modulation of the electron beam ER using the electron beam modulation device 10 described above are performed without ignoring the first term $((<<u>>\cdot\nabla)<<u>>^*)$ in Equation (10) will be described. In Numerical Calculation Example 3, a light field having a Bessel-Gauss (BG) beam-like intensity distribution on the pupil plane represented by the following Equation (19) is adopted as the field of light incident on the condensing element 60.

Equation 13

$$p(r) = \exp\left[\frac{(r - f \sin \theta_0)^2}{w_0^2}\right] \quad (19)$$

Figure 19:
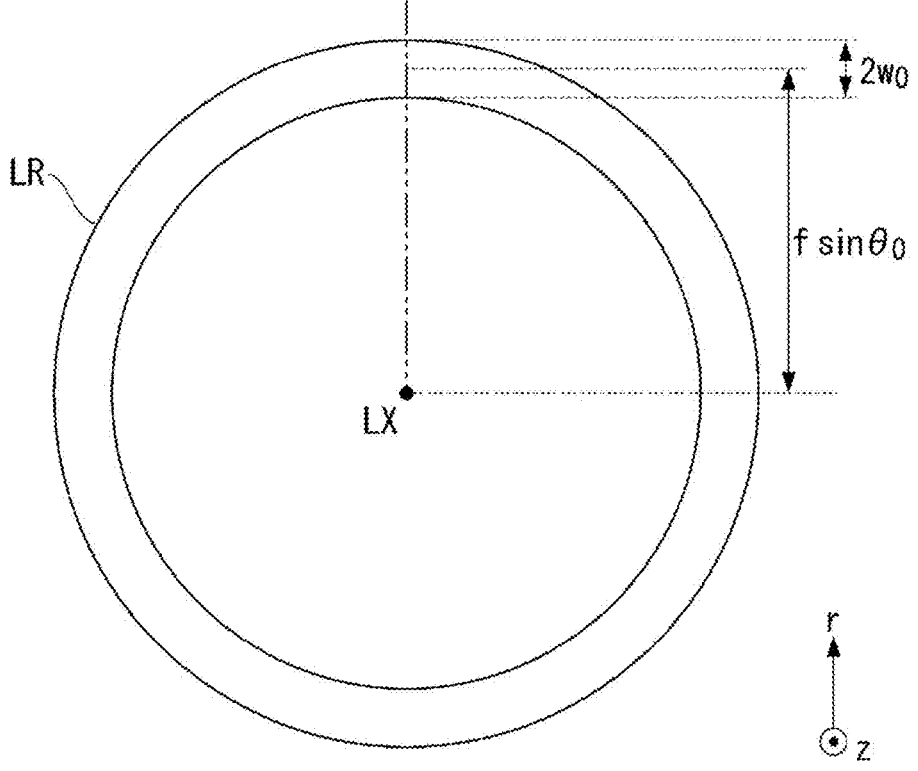
FIG. 19 is a diagram showing a light intensity distribution of laser light in the pupil plane in Numerical Calculation Example 3.

In Equation (19), r represents a variable in the radial direction. f represents the focal length of the condensing element 60. $\theta_0$ represents a condensing angle of the BG beam and is an angle formed by the optical axis LX and a light beam condensed from an outermost peripheral portion of the condensing element 60 to the focal plane 60F. $w_0$ represents half an annular width of the BG beam. As shown in FIG. 19, the annular width of the BG beam is $2w_0$. In Numerical Calculation Example 3, the following conditions were set: wavelength $\lambda$ of laser light LR=1 [μm], f=2 [mm], $w_0$=50 [μm], $\theta_0$=60 degrees, $P_{in}$=100 [W], and $E_e$=1 [keV]. In Numerical Calculation Example 3, the NA of the condensing element 60 was set to 1.1 times the condensing angle $\theta_0$ of the BG beam, that is, 1.1×$\theta_0$. With this setting, the BG beam having an annular shape is condensed without leakage.

Figure 20:
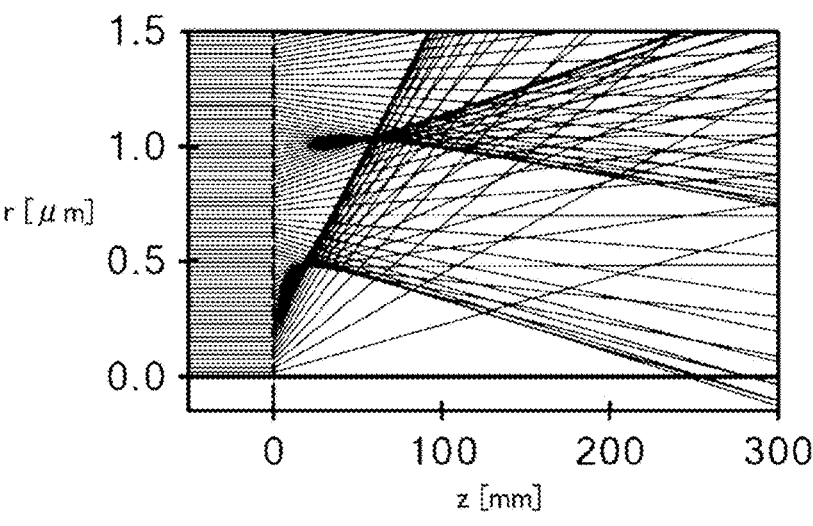
FIG. 20 is a diagram showing a calculation result of a trajectory of an electron beam in Numerical Calculation Example 3.
Figure 21:
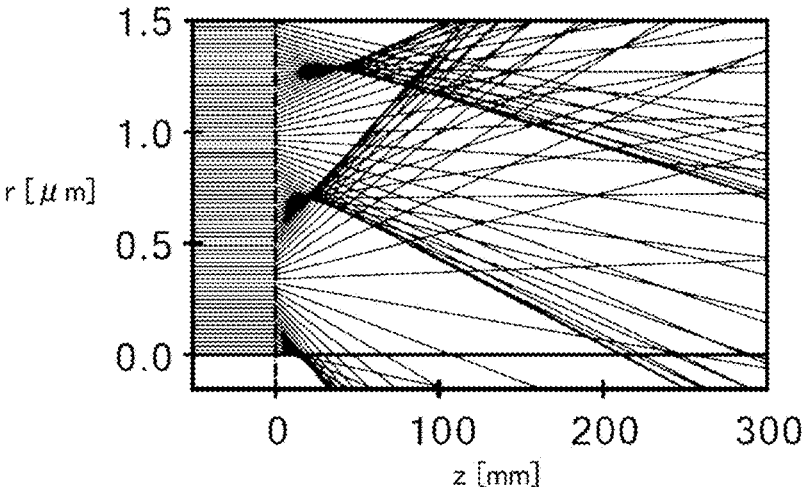
FIG. 21 is a diagram showing a calculation result of a trajectory of the electron beam in Numerical Calculation Example 3.

FIG. 20 shows a result of calculating a trajectory of the electron beam ER in the focal region FF when the direction of polarization of the laser light LR emitted from the conversion plane 34 of the liquid crystal optical element 32 was modulated to R-pol. FIG. 21 shows a result of calculating a trajectory of the electron beam ER in the focal region FF when the direction of polarization of the laser light LR emitted from the conversion plane 34 of the liquid crystal optical element 32 was modulated to R-pol. Comparison between the results shown in FIGS. 20 and 21 and comparison between FIGS. 12 and 18 indicates that the trajectory of the electron beam ER when the BG beam of Equation (13) is introduced without ignoring the first term $((<<u>>\cdot\nabla)<<u>>^*)$ in Equation (10) is similar to the trajectory of the electron beam ER in an approximate case in which the first term $((<<u>>\cdot\nabla)<<u>>^*)$ in Equation (10) was ignored.

Figure 22:
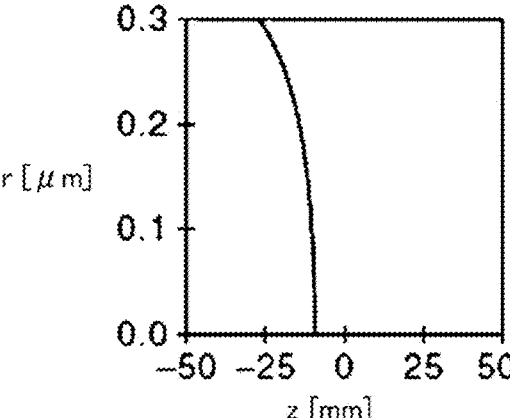
FIG. 22 is a graph showing a distance at which the electron beam intersects the optical axis in Numerical Calculation Example 3.
Figure 23:
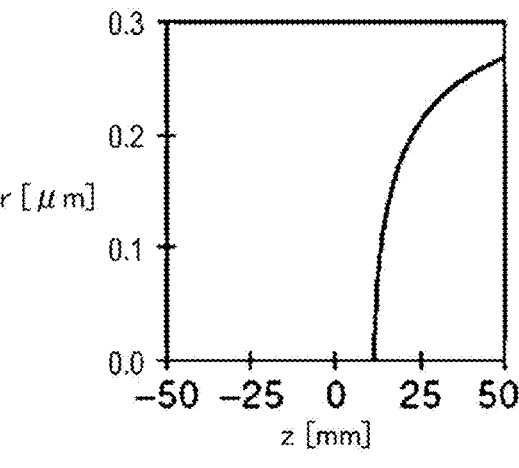
FIG. 23 is a graph showing a distance at which the electron beam intersects the optical axis in Numerical Calculation Example 3.

FIG. 22 shows a result of calculating a distance z at which the electron beam ER intersects the optical axis LX when the direction of polarization of the laser light LR emitted from the conversion plane 34 of the liquid crystal optical element 32 is modulated to R-pol, that is, FIG. 22 is a longitudinal spherical aberration diagram. As shown in FIG. 22, it can be seen that a positive spherical aberration appears. FIG. 23 shows a result of calculating the distance z at which the electron beam ER intersects the optical axis LX when the direction of polarization of the laser light LR emitted from the conversion plane 34 of the liquid crystal optical element 32 is modulated to A-pol, that is, FIG. 23 is a longitudinal spherical aberration diagram. As shown in FIG. 23, it can be seen that a negative spherical aberration appears.

Figure 24:
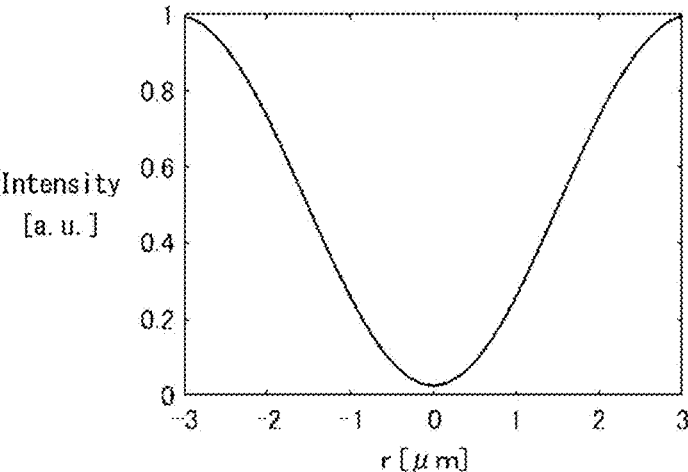
FIG. 24 is a graph showing a calculation result of a light intensity distribution of the round light when a condensing angle of the laser light is 5 degrees in Numerical Calculation Example 3.
Figure 25:
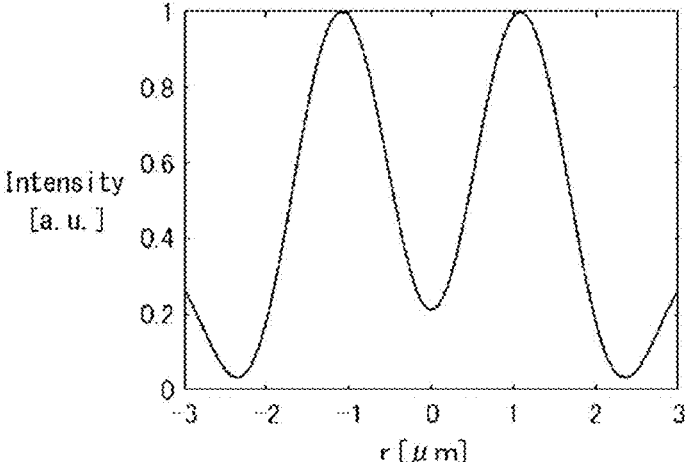
FIG. 25 is a graph showing a calculation result of a light intensity distribution of the round light when the condensing angle of the laser light is 15 degrees in Numerical Calculation Example 3.
Figure 26:
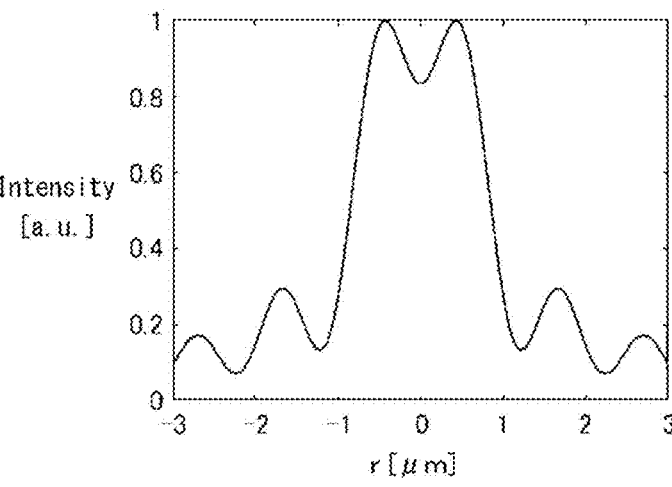
FIG. 26 is a diagram showing a calculation result of a light intensity distribution of the round light when the condensing angle of the laser light is 30 degrees in Numerical Calculation Example 3.
Figure 27:
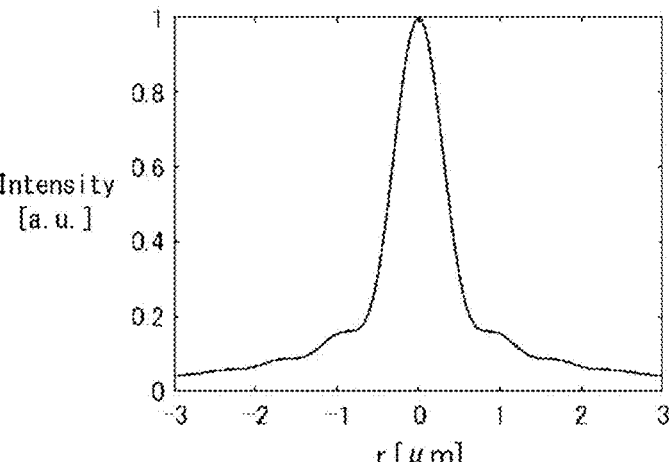
FIG. 27 is a diagram showing a calculation result of a light intensity distribution of the round light when the condensing angle of the laser light is 45 degrees in Numerical Calculation Example 3.
Figure 28:
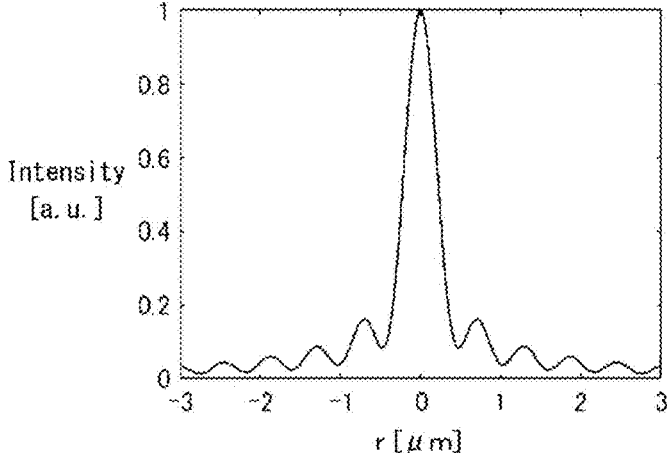
FIG. 28 is a graph showing a calculation result of a light intensity distribution of the round light when the condensing angle of the laser light is 60 degrees in Numerical Calculation Example 3.

FIGS. 24 to 28 show results of calculating light intensity distributions in the optical focal region FF when the condensing angle formed by the laser light LR and the optical axis LX is set to 5 degrees, 15 degrees, 30 degrees, 45 degrees, and 60 degrees, respectively, in a case in which the direction of polarization of the laser light LR emitted from the conversion plane 34 of the liquid crystal optical element 32 is modulated to R-pol. As shown in FIGS. 27 and 28, when the condensing angle formed by the laser light LR and the optical axis LX, that is, the incident angle of the laser light LR on the optical focal region FF was 60 degrees and 45 degrees, a high-intensity portion having a high light intensity was formed at the central portion in the r-direction. As shown in FIGS. 24 to 26, when the condensing angle formed by the laser light LR and the optical axis LX decreased to 30 degrees, 15 degrees, and 5 degrees, the high-intensity portion was formed outwardly in the r-direction, and the low-intensity portion having a light intensity lower than that of the high-intensity portion was formed at the center in the r-direction. That is, when the direction of polarization of the laser light LR is modulated to R-pol, as the condensing angle formed by the laser light LR and the optical axis LX decreases, the light intensity distribution changes from a light intensity distribution having a high-intensity portion at the central portion in the r-direction to a light intensity distribution having a low-intensity portion of substantially zero at the central portion and a high-intensity portion at the outer peripheral portion thereof.

Figure 29:
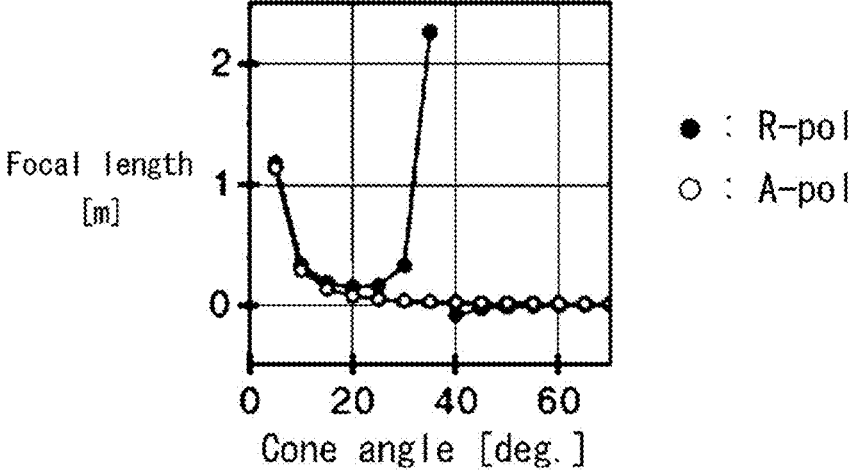
FIG. 29 is a graph showing a calculation result of a focal length of the electron beam traveling in the z-direction along the vicinity of the optical axis in the r-direction when an angle formed by the optical axis and laser light emitted from an outermost peripheral portion of the condensing element is changed in Numerical Calculation Example 3.

FIG. 29 shows the result of calculating a relationship between the condensing angle formed by the laser light LR and the optical axis LX and the focal length of the lens formed by the laser light LR when the direction of polarization of the laser light LR emitted from the conversion plane 34 of the liquid crystal optical element 32 is modulated to R-pol and A-pol. In the case in which the direction of polarization of the laser light LR is modulated to R-pol, when the condensing angle formed by the laser light LR and the optical axis LX is small, that is, when the NA of the condensing element 60 is small, the first term $((<<\text{u}>>\cdot\nabla) <<\text{u}>>^*))$ in Equation (10) is larger than the second term $(<<\text{u}>>\times(\nabla\times<<\text{u}>>^*))$ to the extent that the first term cannot be ignored. Further, as shown in FIG. 29, the laser light LR changes from a state of acting as a concave lens to a state of acting as a convex lens with respect to the electron beam ER incident on the focal region FF. In Numerical Calculation Example 3, the condensing angle of the laser light LR at which the laser light LR is switched from a state of acting as a concave lens to a state of acting as a convex lens is an angle within a range from 30 to 40 degrees. At the condensing angle of the laser light LR at a boundary where the action of the concave lens is switched to the action of the convex lens, the action of the laser light LR as a lens disappears, and the substantial focal length of the lens formed by the laser light LR is infinity (Go).

Figure 30:
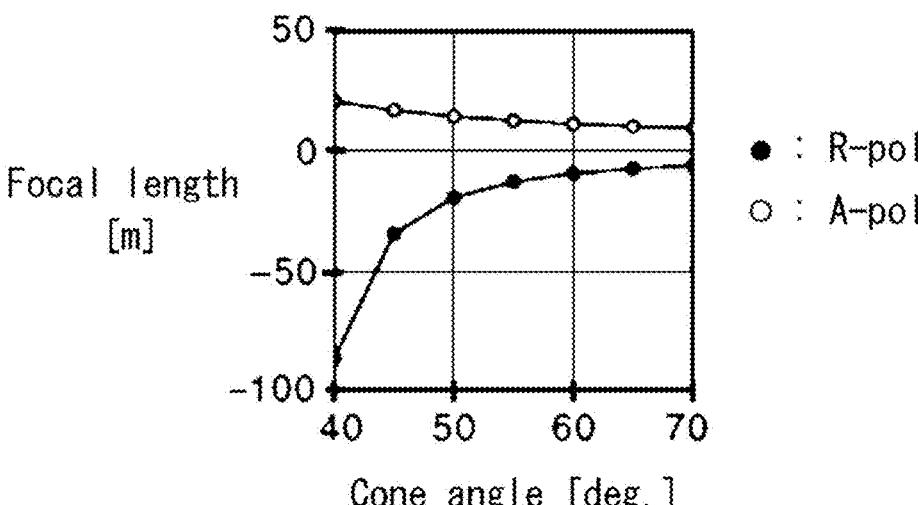
FIG. 30 is a graph showing a calculation result of a focal length of an electron beam traveling in the z-direction along the vicinity of the optical axis in the r-direction when an angle formed by the optical axis and laser light emitted from the outermost peripheral portion of the condensing element is changed in Numerical Calculation Example 3.

As shown in FIGS. 29 and 30, it can be seen that, when the condensing angle of the laser light LR is 25 degrees or less, regardless of whether the direction of polarization of the laser light LR is modulated to R-pol or A-pol, a light intensity distribution having a low-intensity portion at the central portion in the r-direction and a high-intensity portion at the outer peripheral portion is formed, the focal lengths of each lens formed by the laser light LR are equivalent to each other, and the lens formed by the laser light LR acts as a convex lens with a negative spherical aberration. Regardless of whether the direction of polarization of the laser light LR is modulated to R-pol or A-pol, the light intensity distributions in the focal region FF coincide with each other as long as the condensing angle of the laser light LR is sufficiently small and the NAs of each lens formed by the laser light LR are substantially the same.

As described above, when the round light RL or the BG beam is condensed at a condensing angle smaller than the angle at which the round light RL or the BG beam is switched between the convex lens action and the concave lens action, the focal length of the lens formed by the laser light LR is shorter than the focal length of the lens formed by laser light LR having a constant incident light power, and the action of the lens is exhibited but is weak. In this case, the action of the lens formed by the round light RL or the BG beam on the electron beam ER does not depend on the direction of polarization of the laser light LR. When, in the pupil plane 60P of the condensing element 60, the laser light LR has an annular beam shape about the optical axis and the angle $\theta_0$ formed by the laser light LR condensed by the outermost peripheral portion of the condensing element 60 and the optical axis LX is 25 degrees or less, the lens formed by the laser light LR may be a convex lens having a negative spherical aberration. That is, when the laser light LR having an annular beam shape as shown in FIG. 19 is used, the round light RL or the BG beam can act as a convex lens having a negative spherical aberration on the electron beam ER without the laser light LR being condensed at an angle $\theta_0$ larger than 25 degrees.

The action of the lens formed by the round light RL or the BG beam depends only on the light intensity distribution of the laser light LR in the focal plane 60F. Accordingly, the low-intensity portion having a light intensity of substantially zero is formed in the central portion of the focal region FF in the r-direction and annularly about the optical axis LX, whereby the convex lens action is exhibited regardless of the light intensity distribution at the time of incidence of the laser light LR including the round light RL or the BG beam. Further, the high-intensity portion having the maximum light intensity is formed at the central portion in the r-direction and coaxially with the electron beam ER in the focal region FF, whereby the concave lens effect is exhibited regardless of the light intensity distribution at the time of incidence of the laser light LR including the round light RL or the BG beam.

Preferred embodiments according to the present invention have been described above in detail. The present invention is not limited to the embodiments described above. The present invention may be modified within the scope of the gist of the present invention set forth in the appended claims.

For example, the electron beam modulation device 10 described above may include a control part that controls at least one of the wavelength and the power of the laser light LR.

For example, in the electron beam modulation device 10 described above, the polarization conversion part 30 may be configured by a plurality of liquid crystal optical elements or a plurality of phase plates. In this case, the laser light LR need only pass through a plurality of laser light modulation plates whereby the direction of polarization of the laser light LR has a predetermined directional distribution and the intensity of the laser light LR has a predetermined intensity distribution.

Note that the predetermined directional distribution and intensity distribution of the laser light LR passing through the conversion plane 34 of the electron beam modulation device 10 are determined in accordance with the distribution of the trapping potential region NR and the repulsive potential region PR that act on the electron beam ER to modulate the electron beam ER to a desired state in the focal plane 60F. The distribution of the trapping potential region NR and the repulsive potential region PR acting on the electron beam ER can be back-calculated from a desired state of the electron beam ER and calculated quantitatively. Furthermore, the predetermined directional distribution and intensity distribution of the laser light LR passing through the conversion plane 34 can be quantitatively calculated by back-calculation from the distribution of the trapping potential region NR and the repulsive potential region PR described above. Accordingly, the predetermined directional distribution and the intensity distribution of the laser light LR passing through the conversion plane 34 are not limited to the first example of R-pol directional distribution and the first example of the intensity distribution, the second example of A-pol directional distribution and the second example of the intensity distribution, or the directional distribution and the intensity distribution in which the polarization direction of the laser light LR forms a circle when viewed along the optical axis LY as in the third example in the embodiments described above. The predetermined directional distribution and the intensity distribution may be different from those in these examples and may be a desired directional distribution and a desired intensity distribution calculated in accordance with the distribution of the trapping potential region NR and the repulsive potential region PR back-calculated from the desired state of the electron beam ER, as described above.

Note that, as the collimator lens 25, the convex lens 44, and the condensing element 60 of the electron beam modulation device 10 described above, a diffractive optical element such as a diffractive grating or a diffractive lens may be used instead of a refractive optical element such as a prism or a refractive lens. Examples of the diffractive lens include a Fresnel zone plate (FZP), a multi-level zone plate (MLZP), and a Fresnel lens. Further, in the electron beam modulation device 10, a photonic crystal or an optical element other than a photonic crystal that can manipulate the polarization of the laser light LR may be used instead of the liquid crystal optical element 32 that manipulates the polarization of the laser light LR as described above.

DESCRIPTION OF SIGN

10 Electron beam modulation device
20 Light source

30 Polarization conversion part
60 Condensing element
60F Focal plane
LR Laser light
RL Round light

The invention claimed is:

1. An electron beam modulation method comprising:

modulating a direction of polarization and an intensity of laser light emitted from a light source to a predetermined directional distribution and a predetermined intensity distribution, respectively;

condensing, by a condensing element, the laser light modulated to generate round light including a trapping potential region in which electrons are attracted and a repulsive potential region in which the electrons are repelled, the round light having rotational symmetry about an optical axis of the laser light when viewed along the optical axis; and modulating an electron beam incident on the round light in accordance with a distribution of the trapping potential region and the repulsive potential region.

* * * * *